(12) United States Patent
Tian et al.

(10) Patent No.: US 9,099,496 B2
(45) Date of Patent: Aug. 4, 2015

(54) METHOD OF FORMING AN ACTIVE AREA WITH FLOATING GATE NEGATIVE OFFSET PROFILE IN FG NAND MEMORY

(71) Applicant: SANDISK TECHNOLOGIES INC., Plano, TX (US)

(72) Inventors: Ming Tian, Yokkaichi (JP); Jayavel Pachamuthu, San Jose, CA (US); Atsushi Suyama, Osaka (JP); James Kai, Santa Clara, CA (US); Raghuveer S. Makala, Campbell, CA (US); Yao-Sheng Lee, Tampa, FL (US); Johann Alsmeier, San Jose, CA (US); Henry Chien, San Jose, CA (US); Masanori Terahara, Yokkaichi (JP); Hirofumi Watatani, Yokkaichi (JP)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/472,611

(22) Filed: Aug. 29, 2014

(65) Prior Publication Data
US 2014/0367762 A1 Dec. 18, 2014

Related U.S. Application Data

(63) Continuation-in-part of application No. 14/135,931, filed on Dec. 20, 2013.

(60) Provisional application No. 61/807,277, filed on Apr. 1, 2013.

(51) Int. Cl.
*H01L 21/336* (2006.01)
*H01L 29/66* (2006.01)
(Continued)

(52) U.S. Cl.
CPC ...... *H01L 29/66825* (2013.01); *H01L 27/1157* (2013.01); *H01L 27/11524* (2013.01);
(Continued)

(58) Field of Classification Search
CPC ..... H01L 27/11; H01L 27/115; H01L 27/112;
H01L 27/11582; H01L 27/1157; H01L 27/11556; H01L 27/11524; H01L 29/7926; H01L 29/7889; H01L 29/66823; H01L 29/66833
USPC ................. 438/287, 283, 269, 270, 271, 272; 257/329
See application file for complete search history.

(56) References Cited

U.S. PATENT DOCUMENTS 5,084,417 A 1/1992 Joshi et al.
5,807,788 A 9/1998 Brodsky et al.
(Continued)

FOREIGN PATENT DOCUMENTS

WO WO02/15277 A2 2/2002
WO WO2012/003301 A2 1/2012

OTHER PUBLICATIONS

International Search Report & Written Opinion received in connection with international application PCT/US2014/032123, dated Sep. 22, 2014.
(Continued)

*Primary Examiner* — Kevin M Picardat
(74) *Attorney, Agent, or Firm* — The Marbury Law Group PLLC

(57) ABSTRACT

A stack can be patterned by a first etch process to form an opening defining sidewall surfaces of a patterned material stack. A masking layer can be non-conformally deposited on sidewalls of an upper portion of the patterned material stack, while not being deposited on sidewalls of a lower portion of the patterned material stack. The sidewalls of a lower portion of the opening can be laterally recessed employing a second etch process, which can include an isotropic etch component. The sidewalls of the upper portion of the opening can protrude inward toward the opening to form an overhang over the sidewalls of the lower portion of the opening. The overhang can be employed to form useful structures such as an negative offset profile in a floating gate device or vertically aligned control gate electrodes for vertical memory devices.

34 Claims, 13 Drawing Sheets

(51) Int. Cl.
 H01L 29/788 (2006.01)
 H01L 29/792 (2006.01)
 H01L 27/115 (2006.01)
(52) U.S. Cl.
 CPC .... *H01L27/11556* (2013.01); *H01L 27/11582* (2013.01); *H01L 29/66833* (2013.01); *H01L 29/7889* (2013.01); *H01L 29/7926* (2013.01)

(56) References Cited

U.S. PATENT DOCUMENTS

| | | |
|---|---|---|
| 5,915,167 A | 6/1999 | Leedy |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,808,038 B2 | 10/2010 | Mokhlesi et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,053,829 B2 | 11/2011 | Kang et al. |
| 8,187,936 B2 | 5/2012 | Alsmeier et al. |
| 8,193,054 B2 | 6/2012 | Alsmeier |
| 8,198,672 B2 | 6/2012 | Alsmeier |
| 8,349,681 B2 | 1/2013 | Alsmeier et al. |
| 8,614,126 B1 | 12/2013 | Lee et al. |
| 2007/0210338 A1 | 9/2007 | Orlowski |
| 2007/0252201 A1 | 11/2007 | Kito et al. |
| 2009/0283819 A1 | 11/2009 | Ishikawa et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0320528 A1 | 12/2010 | Jeong et al. |
| 2011/0076819 A1 | 3/2011 | Kim et al. |
| 2011/0133606 A1 | 6/2011 | Yoshida et al. |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0146127 A1 | 6/2012 | Lee et al. |
| 2012/0156848 A1 | 6/2012 | Yang et al. |
| 2012/0256247 A1 | 10/2012 | Alsmeier |
| 2013/0248974 A1 | 9/2013 | Alsmeier et al. |
| 2013/0264631 A1 | 10/2013 | Alsmeier et al. |
| 2013/0313627 A1 | 11/2013 | Lee et al. |
| 2014/0008714 A1 | 1/2014 | Makala et al. |
| 2014/0225181 A1 | 8/2014 | Makala et al. |

OTHER PUBLICATIONS

European Patent Office, International Searching Authority, Invitation to Pay Additional Fees for PCT/US2014/032123, issued Jul. 15, 2014.
Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.
Maeda et al., "Multi-Stacked 1G Cell/Layer Pipe-Shaped BiCS Flash Memory," 2009 Symposium on VLSI Technology Digest of Technical Papers, pp. 22-23.
Endoh et al., "Novel Ultra High Density Memory with a Stacked-Surrounding Gate Transistor (S-SGT) Structured Cell," IEDM Proc. (2001) 33-36.
Tanaka et al., "Bit-Cost Scalable Technology for Low-Cost and Ultrahigh-Density Flash Memory," Toshiba Review, vol. 63, No. 2, 2008, pp. 28-31.
Masahide Kimura, "3D Cells Make Terabit NAND Flash Possible," Nikkei Electronics Asia, Sep. 17, 2009, 6pgs.
International Search Report & Written Opinion, PCT/US2011/042566, Jan. 11, 2012.
Invitation to Pay Additional Fees & Partial International Search Report, PCT/US2011/042566, Sep. 28, 2011.
Jang et al., "Memory Properties of Nickel Silicide Nanocrystal Layer for Possible Application to Nonvolatile Memory Devices," IEEE Transactions on Electron Devices, vol. 56, No. 12, Dec. 2009.
Chen et al., "Reliability Characteristics of NiSi Nanocrystals Embedded in Oxide and Nitride Layers for Nonvolatile Memory Application," Applied Physics Letters 92, 152114 (2008).
J. Ooshita, Toshiba Announces 32Gb 3D-Stacked Multi-Level NAND Flash, 3 pages, http://techon.nikkeibp.co.jp/enalish/NEWS_EN/20090619/171977/ Nikkei Microdevices, Tech-On, Jun. 19, 2009.
Li et al., "Sacrificial Polymers for Nanofluidic Channels in Biological Applications", Nanotechnology 14 (2003) 578-583.
U.S. Appl. No. 13/933,743, filed Jul. 2, 2013 SanDisk Technologies Inc.
U.S. Appl. No. 14/135,931, filed Dec. 20, 2013 SanDisk Technologies Inc.

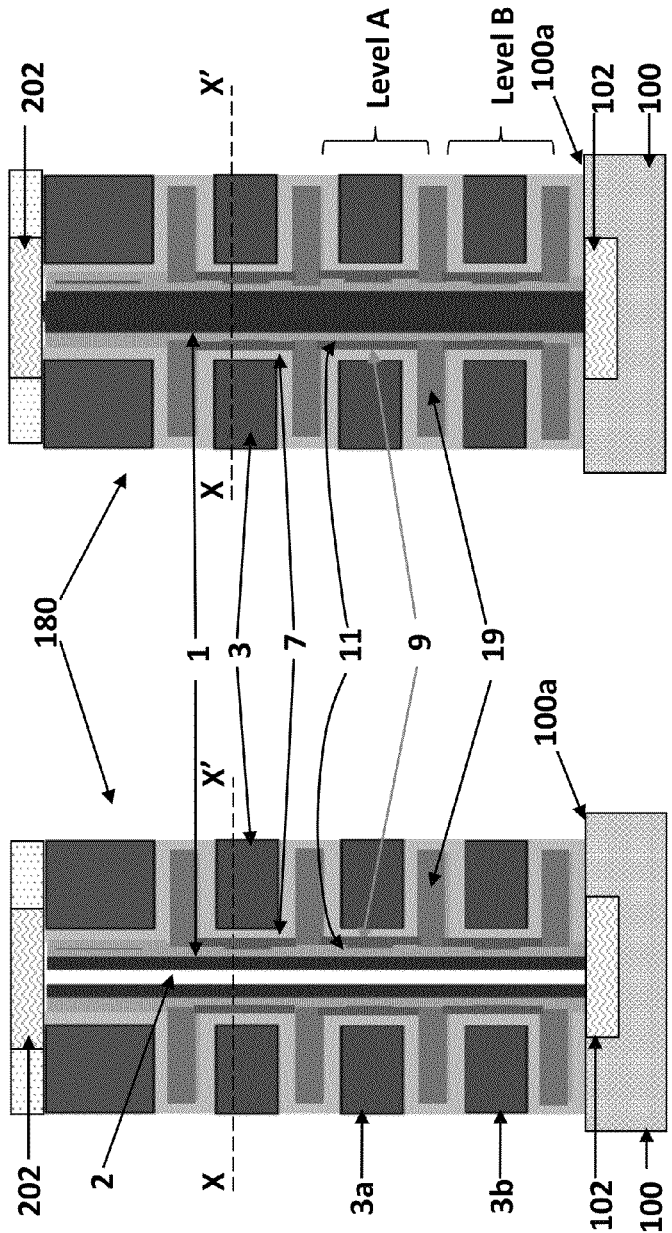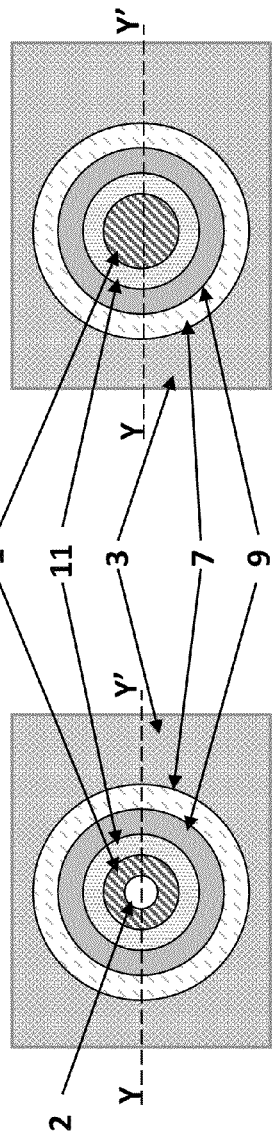

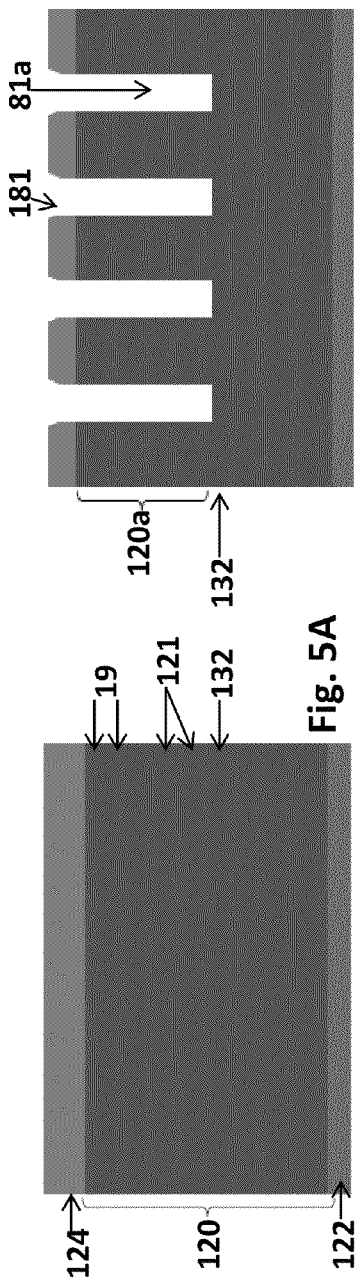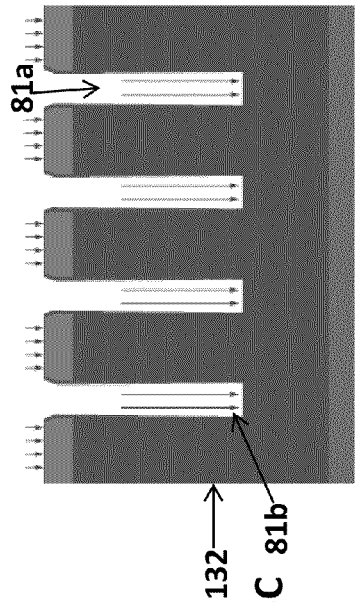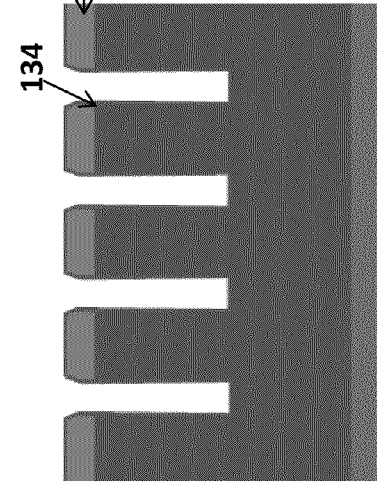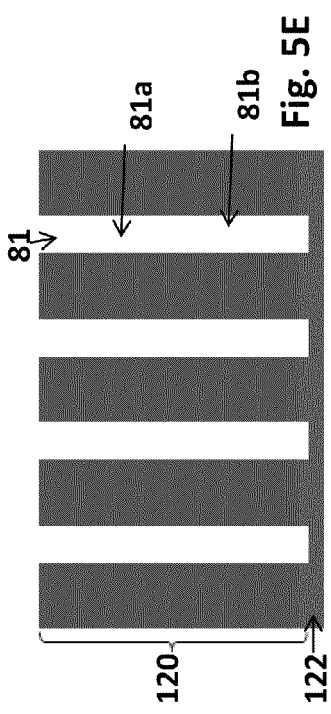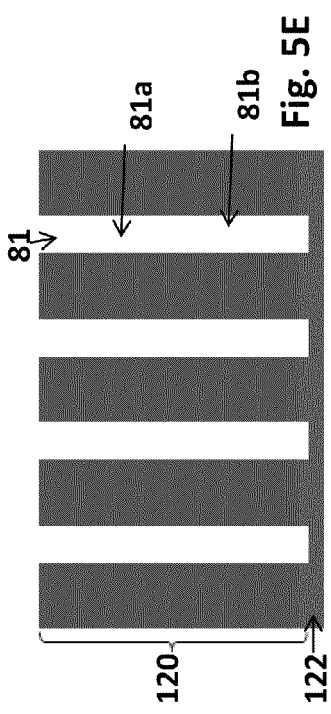

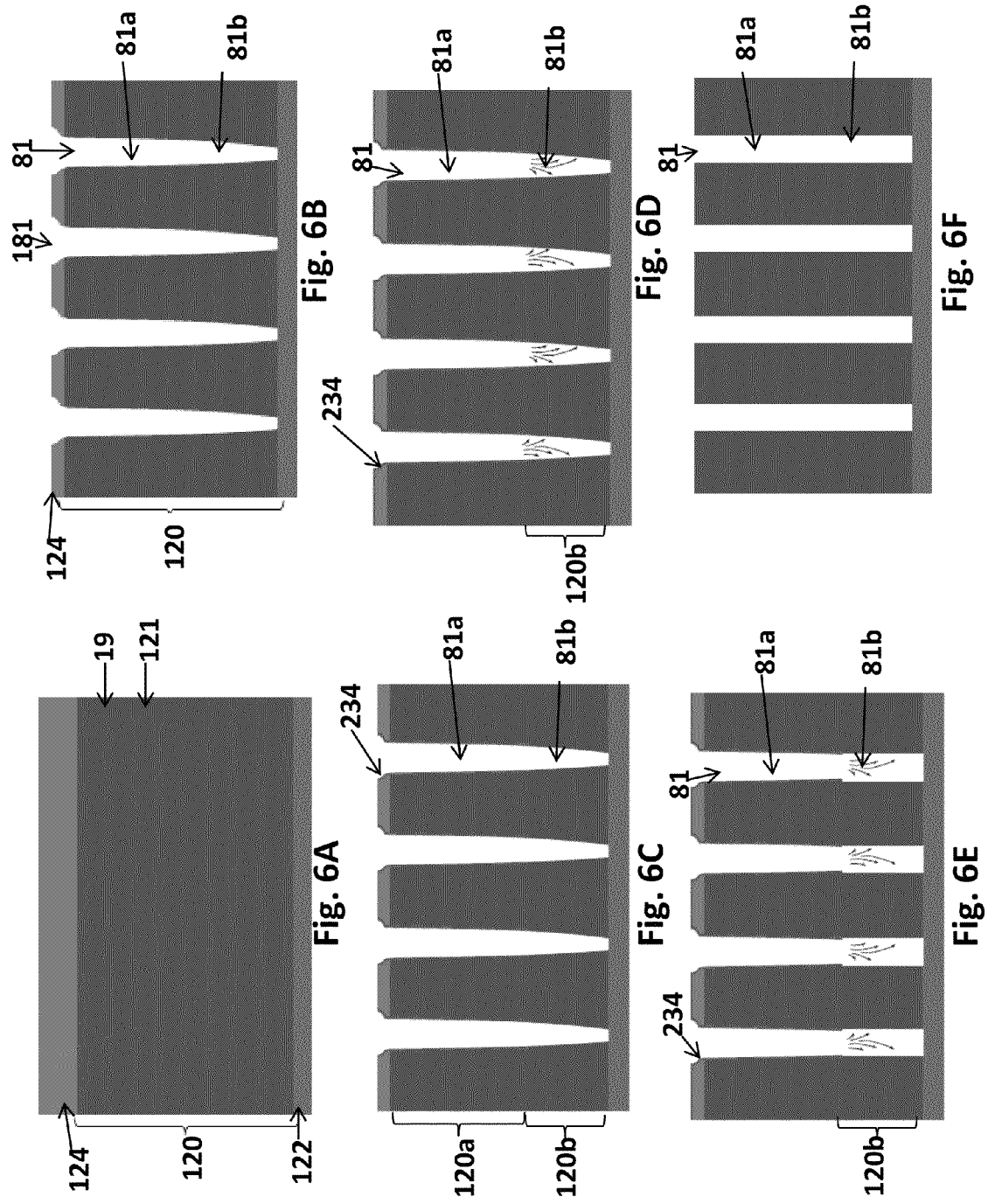

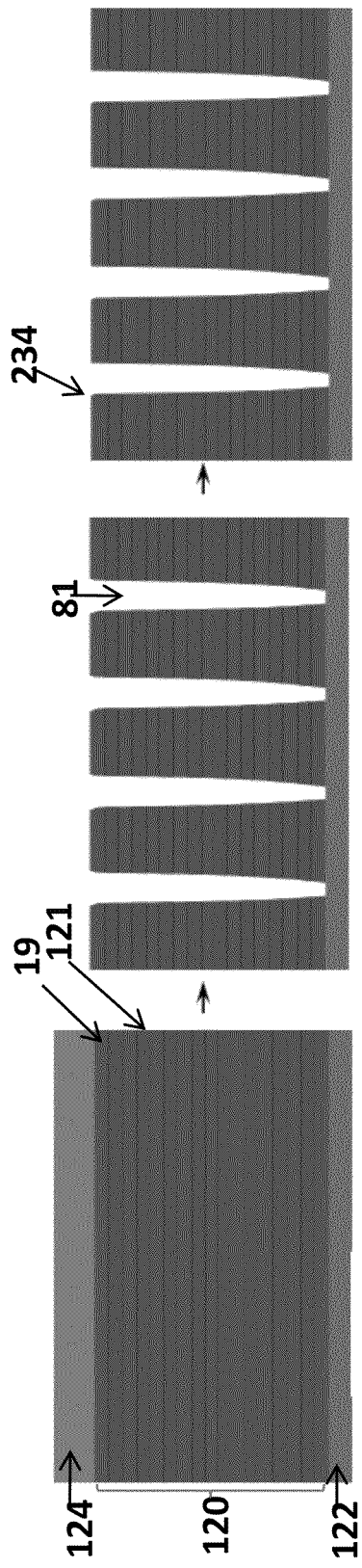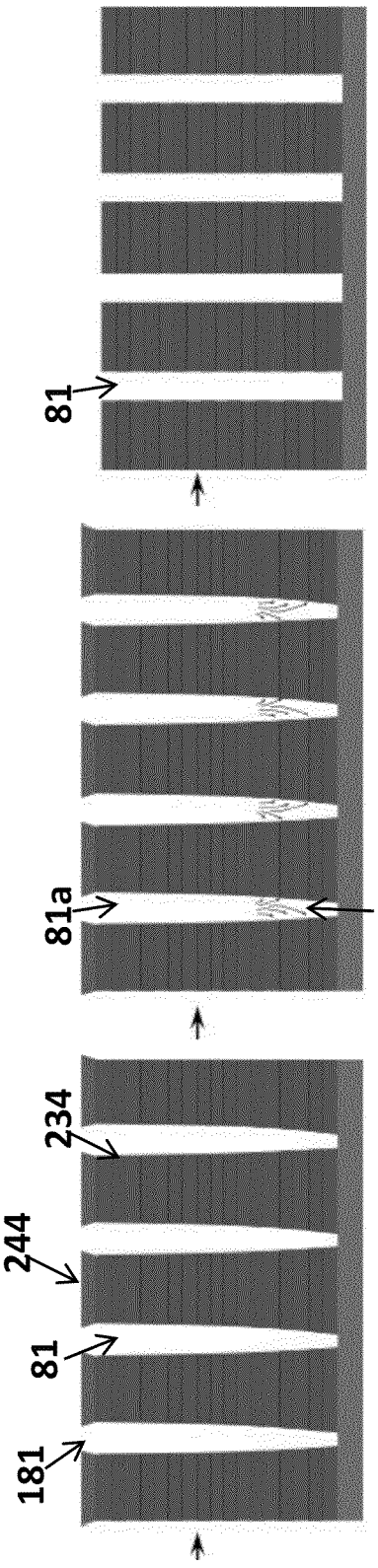

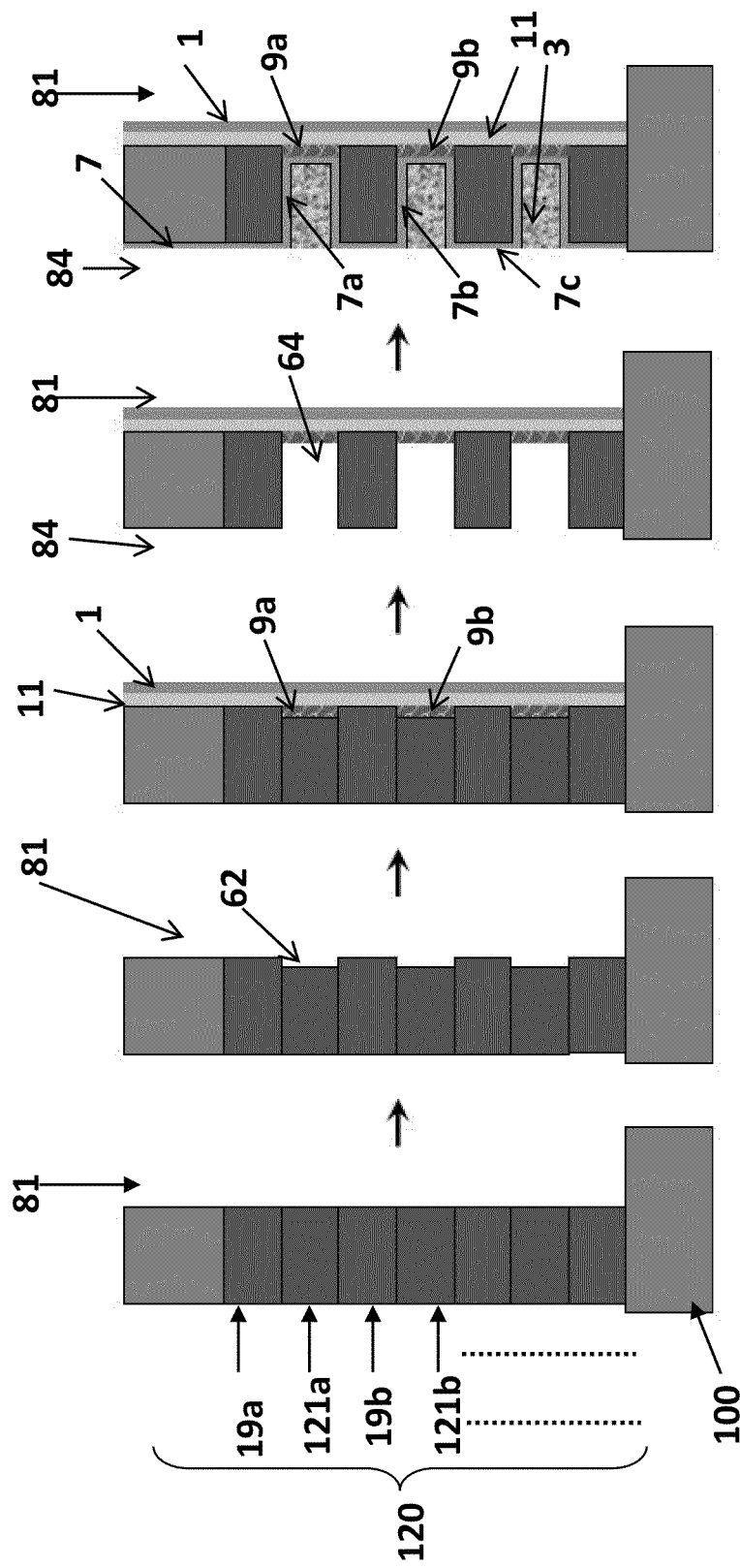

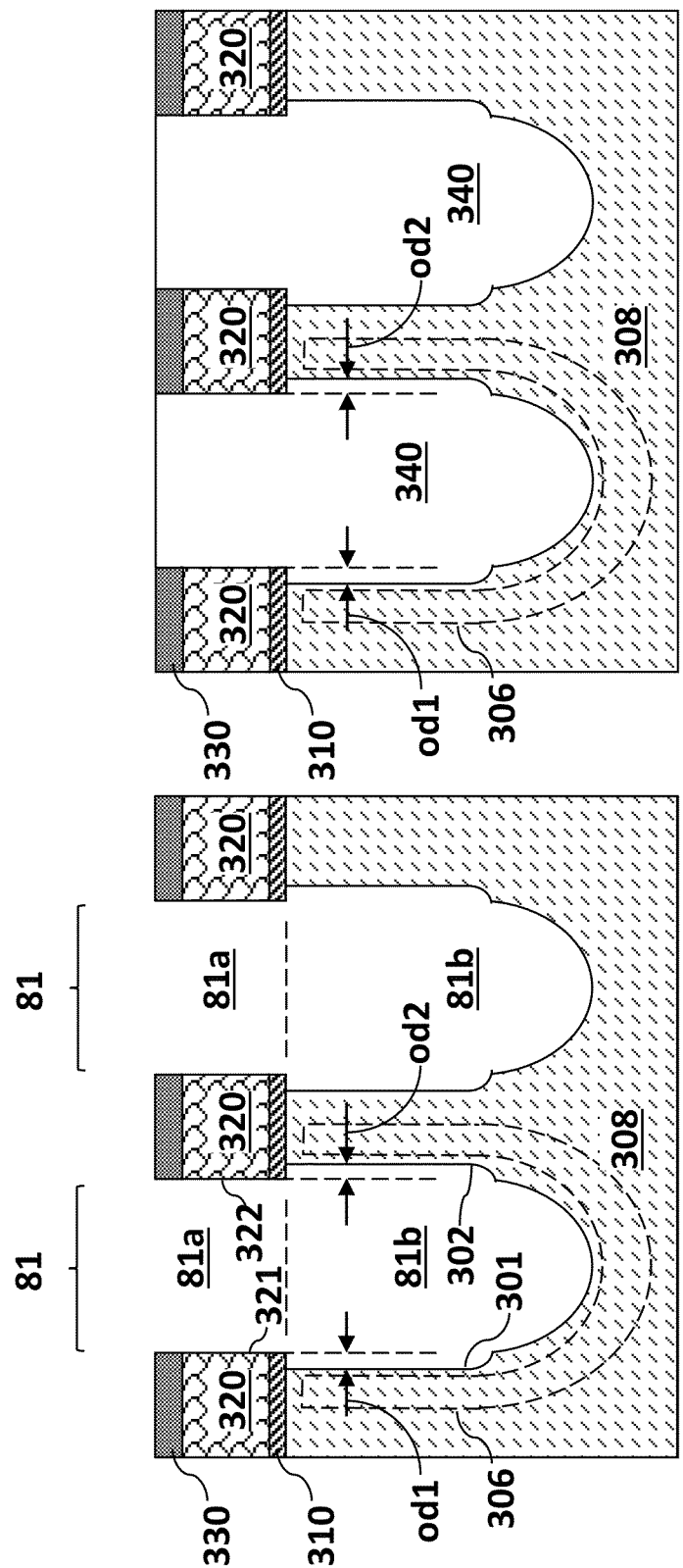

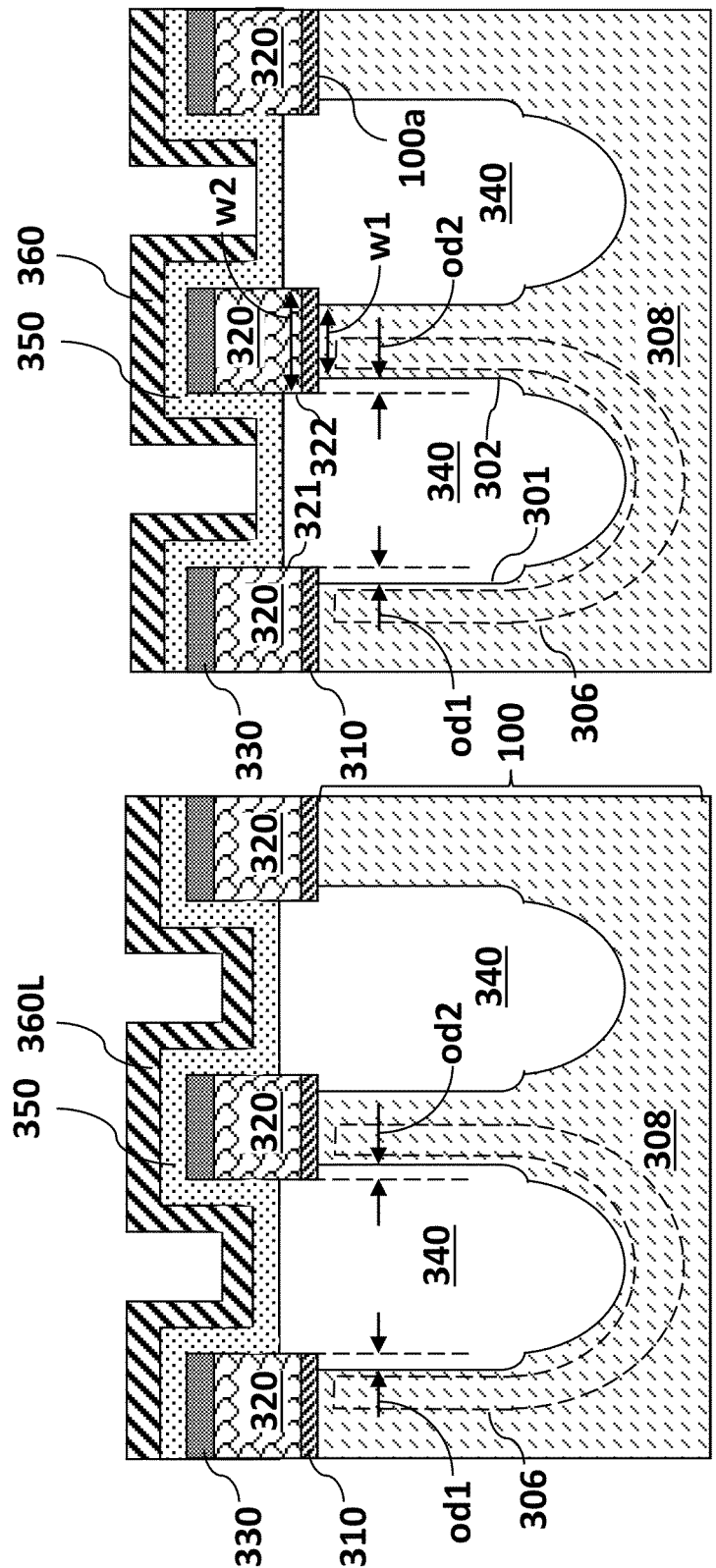

METHOD OF FORMING AN ACTIVE AREA WITH FLOATING GATE NEGATIVE OFFSET PROFILE IN FG NAND MEMORY

RELATED APPLICATION

This application is a continuation-in-part application of, and claims the benefit of priority from, U.S. patent application Ser. No. 14/135,931 filed on Dec. 20, 21013, the entire contents of which are incorporated by reference herein.

FIELD

The present disclosure relates generally to the field of semiconductor devices and specifically to floating gate semiconductor devices such as floating gate NAND memory devices.

BACKGROUND

Three-dimensional vertical NAND strings are disclosed in an article by T. Endoh, et al., titled "Novel Ultra High Density Memory With A Stacked-Surrounding Gate Transistor (S-SGT) Structured Cell", IEDM Proc. (2001) 33-36. However, this NAND string provides only one bit per cell. Furthermore, the active regions of the NAND string is formed by a relatively difficult and time consuming process involving repeated formation of sidewall spacers and etching of a portion of the substrate, which results in a roughly conical active region shape.

Alternatively, NAND strings can be formed along a horizontal direction on a surface of a substrate. In such a configuration, the tunneling dielectrics can laterally extend along the horizontal direction. The overlap between the active areas and the tunneling dielectrics of a horizontal NAND string can affect performance and reliability of the NAND string.

SUMMARY

An embodiment relates to a method of making a semiconductor device includes forming a stack of alternating layers of a first material and a second material over a substrate, etching the stack to form at least one opening extending partially through the stack and forming a masking layer on a sidewall and bottom surface of the at least one opening. The method also includes removing the masking layer from the bottom surface of the at least one opening while leaving the masking layer on the sidewall of the at least one opening, and further etching the at least one opening to extend the at least one opening further through the stack while the masking layer remains on the sidewall of the at least one opening.

Another embodiment relates to a method of making a semiconductor device including forming a stack of alternating layers of a first material and a second material over a substrate and etching the stack to form at least one opening in the stack. The at least one opening may comprise a tapered opening having an upper portion which is wider than a lower portion. The method also includes forming a masking layer on a sidewall of the upper portion of the at least one opening while the lower portion of the at least one opening is not covered by the masking layer, and further etching the lower portion of the at least one opening to widen the lower portion of the at least one opening while the masking layer remains on the sidewall of the upper portion of the at least one opening.

Yet another embodiment relates to a semiconductor device comprising a stack containing, from bottom to top, a semiconductor channel located in a substrate, a tunnel dielectric layer contacting the semiconductor channel at an interface, and a charge storage region electrically separated from the semiconductor channel by the tunnel dielectric layer. A sidewall of the charge storage region overhangs a sidewall of the semiconductor channel along a direction parallel to the interface by an offset distance that is greater than 1 nm.

Even another embodiment relates to a semiconductor device comprising a semiconductor material pillar extending in a first direction, and a charge storage material pillar extending in the first direction and separated from the semiconductor material pillar by a tunnel dielectric layer. A portion of the semiconductor material pillar adjacent to the tunnel dielectric layer has a first width in a second direction perpendicular to the first direction. The first width is at least 2 nm less than a second width of a portion of the charge storage material pillar that is adjacent to the tunnel dielectric layer.

Still another embodiment relates to a method of making a semiconductor device. A stack is provided, which includes, from bottom to top, a semiconductor material layer located in a substrate, a tunnel dielectric layer contacting the semiconductor material layer at an interface, and a charge storage material layer electrically separated from the semiconductor material layer by the tunnel dielectric layer. An opening is formed in the stack. The opening has a sidewall that includes a sidewall of the semiconductor material layer and a sidewall of the charge storage material layer. A masking layer is formed to cover the sidewall of the charge storage material layer while leaving the sidewall of the semiconductor material layer physically exposed. The sidewall of the semiconductor material layer is laterally recessed by an etch process while the masking layer is present on the sidewall of the charge storage material layer. The sidewall of the charge storage material layer overhangs the laterally recessed sidewall of the semiconductor material layer by an offset distance along a direction parallel to the interface.

Further another embodiment relates to a method of manufacturing a semiconductor device. A stack of layers comprising a first material and a second material is provided. An opening is formed in the stack employing a first etch process. An upper portion of the opening is wider than a lower portion of the opening. A masking layer is formed on a sidewall of the upper portion of the opening, while the lower portion of the opening is not covered by the masking layer. Portions of the stack is laterally recessed around the lower portion by a second etch process, while the masking layer remains on the sidewall of the upper portion of the opening.

BRIEF DESCRIPTION OF THE DRAWINGS

FIGS. 1A-1B are respectively side cross sectional and top cross sectional views of a NAND string of one embodiment. FIG. 1A is a side cross sectional view of the device along line Y-Y' in FIG. 1B, while FIG. 1B is a side cross sectional view of the device along line X-X' in FIG. 1A.

FIGS. 2A-2B are respectively side cross sectional and top cross sectional views of a NAND string of another embodiment. FIG. 2A is a side cross sectional view of the device along line Y-Y' in FIG. 2B, while FIG. 2B is a side cross sectional view of the device along line X-X' in FIG. 2A.

FIGS. 5A-5E, 6A-6F, 7A-7F and 8A-8E illustrate embodiment methods of making NAND strings.

FIGS. 9A-9H illustrate a sequential cross-sectional view of an exemplary device structure for a NAND string during a manufacturing sequence according to an embodiment of the present disclosure.

DETAILED DESCRIPTION

Figure 3:
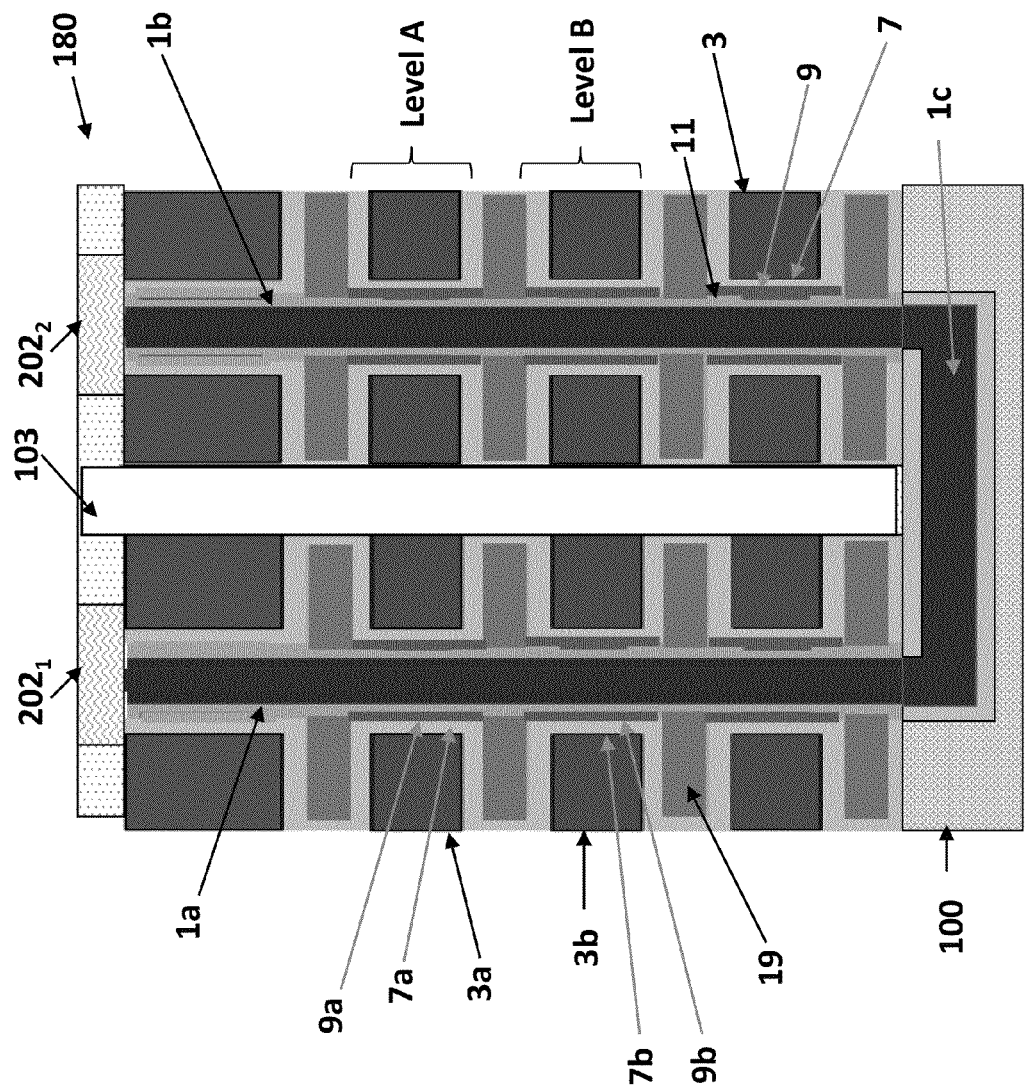
FIG. 3 is side cross sectional view of a NAND string of an embodiment with a U-shaped channel.

The embodiments of the disclosure provide a monolithic, three-dimensional array of semiconductor devices, such as an array of vertical NAND strings located in high aspect ratio openings which are formed using a sidewall spacer.

The present inventors realized that vertical NAND device fabrication relies heavily on reactive ion etching ("RIE") of very high aspect ratio (e.g., at least a 40:1, such as 40:1 to 100:1 height to width ratio) of memory openings in a stack of alternating layers. This etching suffers from several drawbacks, such as etch profile variation resulting in variation of critical diameter between the top and bottom of the memory opening, bowing across the length of the memory opening, hard mask erosion, and critical diameter non-uniformity between memory openings at the center, middle and edge of the substrate. These drawbacks limit the number of memory layers that can be controllably etched within acceptable process. variations.

The embodiments of the present disclosure provide a solution to the aforementioned drawbacks by using a spacer passivation of memory opening sidewalls to improve the etch profiles of the multilayer stacks. In a first embodiment, the memory opening is partially etched in the stack followed by a conformal spacer deposition in the memory opening. The spacer protects the sidewalls of already etched features (e.g. upper layers of the stack) from being over etched. The memory opening etching is then continued to form the bottom part of the opening.

In a second embodiment, the memory opening is completely etched through the stack followed by a non-conformal spacer deposition in the memory opening. The deposition of the non-conformal spacer is tuned so that the thickness drops from a finite value (at the upper end of the memory opening) to near-zero thickness towards the lower end of the opening (preferably at about ⅔rds depth of the etched opening). An over etch step is then used to widen the critical diameter of the opening that is not protected by the spacer (in the lower end of the opening, such as in the lower third of the opening). In both embodiments, an additional step may be used to remove the spacer after the memory opening etching is completed.

The NAND strings are vertically oriented, such that at least one memory cell is located over another memory cell. This allows vertical scaling of NAND devices to provide a higher density of memory cells per unit area of silicon or other semiconductor material.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three-dimensional Structure Memory." The substrates may be thinned or removed from the memory levels before bonding, but as the memory levels are initially formed over separate substrates, such memories are not true monolithic three-dimensional memory arrays.

Figure 4:
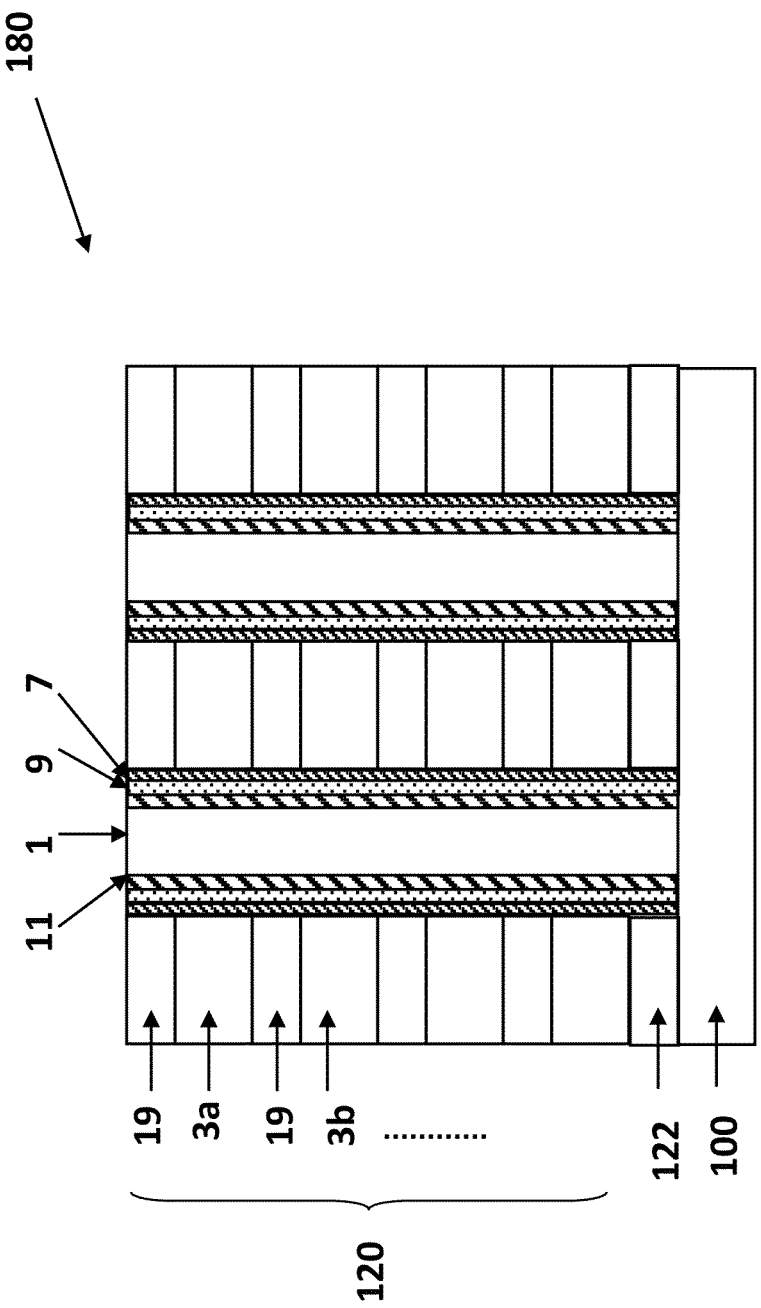
FIG. 4 is side cross sectional view of a NAND string of another embodiment.

In some embodiments, the monolithic three-dimensional NAND string 180 comprises a semiconductor channel 1 having at least one end portion extending substantially perpendicular to a major surface 100a of a substrate 100, as shown in FIGS. 1A, 2A and 4. For example, the semiconductor channel 1 may have a pillar shape and the entire pillar-shaped semiconductor channel extends substantially perpendicularly to the major surface of the substrate 100, as shown in FIGS. 1A, 2A and 4. In these embodiments, the source/drain electrodes of the device can include a lower electrode 102 provided below the semiconductor channel 1 and an upper electrode 202 formed over the semiconductor channel 1, as shown in FIGS. 1A and 2A.

Alternatively, the semiconductor channel 1 may have a U-shaped pipe shape, as shown in FIG. 3. The two wing portions 1a and 1b of the U-shaped pipe shape semiconductor channel may extend substantially perpendicular to the major surface 100a of the substrate 100, and a connecting portion 1c of the U-shaped pipe shape semiconductor channel 1 connects the two wing portions 1a, 1b extends substantially parallel to the major surface 100a of the substrate 100. In these embodiments, one of the source or drain electrodes $202_1$ contacts the first wing portion of the semiconductor channel from above, and another one of a source or drain electrodes $202_2$ contacts the second wing portion of the semiconductor channel 1 from above. An optional body contact electrode (not shown) may be disposed in the substrate 100 to provide body contact to the connecting portion of the semiconductor channel 1 from below. The NAND string's select or access transistors are not shown in FIGS. 1-4 for clarity.

In some embodiments, the semiconductor channel 1 may be a filled feature, as shown in FIGS. 2A-2B, 3 and 4. In some other embodiments, the semiconductor channel 1 may be hollow, for example a hollow cylinder filled with an insulating fill material 2, as shown in FIGS. 1A-1B. In these embodiments, an insulating fill material 2 may be formed to fill the hollow part surrounded by the semiconductor channel 1. The U-shaped pipe shape semiconductor channel 1 shown in FIG. 3 and/or the channel 1 shown in FIG. 4 may alternatively be a hollow cylinder filled with an insulating fill material 2, shown in FIGS. 1A-1B.

The substrate 100 can be any semiconducting substrate known in the art, such as monocrystalline silicon, IV-IV compounds such as silicon-germanium or silicon-germanium-carbon, III-V compounds, II-VI compounds, epitaxial layers over such substrates, or any other semiconducting or non-semiconducting material, such as silicon oxide, glass, plastic, metal or ceramic substrate. The substrate 100 may include integrated circuits fabricated thereon, such as driver circuits for a memory device.

Any suitable semiconductor materials can be used for semiconductor channel 1, for example silicon, germanium, silicon germanium, or other compound semiconductor materials, such as III-V, II-VI, or conductive or semiconductive oxides, etc. The semiconductor material may be amorphous, polycrystalline or single crystal. The semiconductor channel material may be formed by any suitable deposition methods. For example, in one embodiment, the semiconductor channel material is deposited by low pressure chemical vapor deposition (LPCVD). In some other embodiments, the semiconductor channel material may be a recyrstallized polycrystalline semiconductor material formed by recrystallizing an initially deposited amorphous semiconductor material.

The insulating fill material 2 may comprise any electrically insulating material, such as silicon oxide, silicon nitride, silicon oxynitride, or other high-k insulating materials.

The monolithic three-dimensional NAND string further comprise a plurality of control gate electrodes 3, as shown in FIGS. 1A-1B, 2A-2B, 3 and 4. The control gate electrodes 3 may comprise a portion having a strip shape extending substantially parallel to the major surface 100a of the substrate 100. The plurality of control gate electrodes 3 comprise at least a first control gate electrode 3a located in a first device level (e.g., device level A) and a second control gate electrode 3b located in a second device level (e.g., device level B) located over the major surface 100a of the substrate 100 and below the device level A. The control gate material may comprise any one or more suitable conductive or semiconductor control gate material known in the art, such as doped polysilicon, tungsten, copper, aluminum, tantalum, titanium, cobalt, titanium nitride or alloys thereof. For example, the control gate material in FIGS. 1A, 2A and 3 may comprise a conductive metal or metal alloy, such as tungsten and/or titanium nitride, while the control gate material in FIG. 4 may comprise doped polysilicon.

A blocking dielectric 7 is located adjacent to the control gate(s) 3 and may surround the control gate 3, as shown in FIGS. 1A, 2A and 3. Alternatively, a straight blocking dielectric layer 7 may be located only adjacent to an edge (i.e., minor surface) of each control gate 3, as shown in FIG. 4. The blocking dielectric 7 may comprise a layer having plurality of blocking dielectric segments located in contact with a respective one of the plurality of control gate electrodes 3, for example a first dielectric segment 7a located in device level A and a second dielectric segment 7b located in device level B are in contact with control electrodes 3a and 3b, respectively, as shown in FIG. 3. Alternatively, the blocking dielectric 7 may be a straight, continuous layer, as shown in FIG. 4.

The monolithic three-dimensional NAND string also comprise a charge storage region 9. The charge storage region 9 may comprise one or more continuous layers which extend the entire length of the memory cell portion of the NAND string, as shown in FIG. 4. For example, the charge storage region 9 may comprise an insulating charge trapping material, such as a silicon nitride layer.

Alternatively, the charge storage region may comprise a plurality of discrete charge storage regions 9, as shown in FIGS. 1A, 2A and 3. The plurality of discrete charge storage regions 9 comprise at least a first discrete charge storage region 9a located in the device level A and a second discrete charge storage region 9b located in the device level B, as shown in FIG. 3. The discrete charge storage regions 9 may comprise a plurality of vertically spaced apart, conductive (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof), or semiconductor (e.g., polysilicon) floating gates. Alternatively, the discrete charge storage regions 9 may comprise an insulating charge trapping material, such as silicon nitride segments.

The tunnel dielectric layer 11 of the monolithic three-dimensional NAND string is located between charge storage region 9 and the semiconductor channel 1.

The blocking dielectric 7 and the tunnel dielectric layer 11 may be independently selected from any one or more same or different electrically insulating materials, such as silicon oxide, silicon nitride, silicon oxynitride, or other insulating materials. The blocking dielectric 7 and/or the tunnel dielectric layer 11 may include multiple layers of silicon oxide, silicon nitride and/or silicon oxynitride (e.g., ONO layers).

FIGS. 5A-5E illustrate a method of making a high aspect ratio opening in a stack of alternating layers using sidewall spacer passivation of the opening according to a first embodiment of the disclosure.

Referring to FIG. 5A, a stack 120 of alternating layers 19 and 121 are formed over the major surface of the substrate 100. Layers 19, 121 may be deposited over the substrate by any suitable deposition method, such as sputtering, CVD, PECVD, MBE, etc. The layers 19, 121 may be 6 to 100 nm thick and there may be 32-64 pairs of layers 19, 121 in the stack 120. Layers 19 and 121 are comprised of different materials from each other.

The first layers 19 comprise an electrically insulating material. Any suitable insulating material may be used, such as silicon oxide, silicon nitride, silicon oxynitride, a high-k dielectric (e.g., aluminum oxide, hafnium oxide, etc. or an organic insulating material).

In one aspect of this embodiment, the second layers 121 comprise the control gate material, such as doped polysilicon. In this aspect, layers 121 will be retained in the final device as the control gates 3, and the memory film comprising the blocking dielectric 7, the charge storage region 9 and the tunnel dielectric layer 11 will be formed through the same front side memory opening as the channel 1 to form the NAND string shown in FIG. 4.

In another aspect of this embodiment, the second layers 121 comprise a sacrificial material, such a semiconductor material, conductive material (e.g., metal) or insulating material (e.g., silicon nitride). The sacrificial layers 121 will be eventually removed from the stack 120 though a back side opening and replaced with the combination of the electrically conductive control gates 3, such as tungsten control gates 3, and clam shaped blocking dielectric segments 7, as shown in FIGS. 1A, 2A and 3.

For example, sacrificial layers 121 may comprise silicon, such as amorphous silicon or polysilicon, or another semiconductor material, such as a group IV semiconductor, including silicon-germanium and germanium. Sacrificial layers 121 may comprise intrinsic or undoped (if the as-deposited material inherently has a low p-type or n-type conductivity) semiconductor material, such as intrinsic or undoped polysilicon or amorphous silicon. However, p-type or n-type doped semiconductor materials, such as lightly or heavily doped materials may also be used if desired. The term heavily doped includes semiconductor materials doped n-type or p-type to a concentration of above $10^{18}$ cm$^{-3}$. In contrast, lightly doped semiconductor materials have a doping concentration below $10^{18}$ cm$^{-3}$ and intrinsic semiconductor materials have a doping concentration below $10^{15}$ cm$^{-3}$.

If desired, an optional lower etch stop layer 122 may be formed below the stack 120. If the stack 120 comprises silicon oxide layers 19 and doped polysilicon layers 121, then the etch stop layer 122 may comprise silicon nitride or another material which has a lower etch rate than the etch rate of layers 19 and 121. For example, the etch stop layer 122 may be made of a mid-k to high-k metal oxide, such as an aluminum based dielectric (e.g., stoichiometric $Al_2O_3$ or non-stoichiometric aluminum oxide) or a titanium based dielectric (e.g., stoichiometric $TiO_2$ or non-stoichiometric titanium oxide), or a tantalum based dielectric (e.g., stoichiometric $Ta_2O_5$ or non-stoichiometric tantalum oxide), or nitrogen doped silicon carbide (e.g., silicon carbonitride, SiC(N)) which is resistant to fluorine based plasma. Alternatively, the etch stop layer may comprise aluminum nitride, aluminum oxynitride, silicon carbide or another suitable etch stop material. The etch stop is typically thin, such as 10-70 nm, such as 20-50 nm thick.

If desired, an optional intermediate etch stop layer 132 may be located in the stack 120, such as between the top 25% and bottom 25% of the stack height, for example at the 50% of the stack height. Layer 132 may comprise the same or different etch stop material as layer 122. For example, layer 132 may be a silicon nitride layer 132 in a stack of silicon oxide 19 and polysilicon layers 121. In summary, the intermediate etch stop layer 132 may be formed between a lower portion and an upper portion of the stack 120, and/or the lower etch stop layer 122 may be formed under the stack 120.

Furthermore, an optional hard mask layer or layers 124 may be formed over the stack. The hard mask layer 124 may be any suitable hard mask material which has a lower etch rate than the stack layers 19, 121. For example, the hard mask layer 124 may comprise amorphous carbon, doped carbon, silicon nitride, silicon carbide, tungsten, tungsten nitride etc.

As shown in FIG. 5B, the stack 120 is etched to form at least one memory opening 81a extending partially through the stack 120 (e.g., through the upper portion 120a of the stack). Preferably, a plurality of memory openings 81a are formed, as shown in FIG. 5B.

The openings 81a may be formed by patterning the hard mask 124 to form at least one hard mask opening 181 which exposes the stack 120, followed by etching the stack 120 through the at least one hard mask opening 181 to form at least one opening 81a extending partially through the upper portion 120a of the stack 120. The openings 81a may be formed by photolithographic patterning of a photoresist (not shown for clarity), etching the hard mask layer 124 using the patterned photoresist as a mask to form openings 181, followed by RIE of the upper portion 120a of the stack 120 through openings 181 using the patterned hard mask layer 124 as a mask.

Each opening 81a may extend 25% to 75% through the stack 120, such as about half way through the stack, stopping on any suitable layer in the stack. If the optional intermediate etch stop layer 132 is located in the stack 120, then the partial etch stops on layer 132.

As shown in FIG. 5C, a masking layer 134 is formed on a sidewall and bottom surface of the at least one opening 81a. Preferably, layer 134 is formed on sidewalls and bottom surfaces of all openings 81a and over the top surface of the hard mask 124. The masking layer 134 preferably comprises a conformal spacer deposited by atomic layer deposition (ALD) or chemical vapor deposition (CVD). Layer 134 is deposited conformally in the openings 81a such that it does not fill the entire volume of the openings 81a. As noted above, layer 134 may have a thickness of 3 to 50 nm, such as 5 to 25 nm, and may be made of any suitable protective material, such as amorphous carbon, silicon nitride, silicon oxide, metal oxide or metal nitride (e.g., HfOx, TaOx, AlOx, AlNx, etc.).

The masking layer 134 is removed from the bottom surface of the at least one opening 81a while leaving the masking layer on the sidewall of the at least one opening 81a, as shown in FIG. 5D. Layer 134 may also removed from the top surface of the hard mask layer 124. The removal step preferably comprises a highly directional RIE step, similar to a sidewall spacer etch step, as shown by the arrows in FIG. 5D. A low pressure, high bias RIE process can be used for strong ion bombardment.

After removing layer 134 at the bottom of the openings 81a, the RIE process shown in FIG. 5D may optionally be continued to extend the openings 81a into the lower part of the stack to form openings 81b. Alternatively, the RIE process stops after removing layer 134 from the bottom of the upper openings 81a and the etching chemistry is switched to etch the lower openings 81b in the lower part of the stack 120. In either case, the further etching of the at least one opening 81a using the same RIE chemistry or a different etching chemistry extends the at least one opening further through the stack while the masking layer 134 remains on the sidewall of the at least one opening 81a. If the intermediate etch stop layer 132 is present in the stack, then the further etching extends the at least one opening 81a through the intermediate etch stop layer 132 and through the lower portion of the stack 120 to the lower etch stop layer 122 while the masking layer 134 remains on the sidewall of the at least one opening 81a. If desired, the opening may be etched further through the lower etch stop layer 122 to extend to the underlying layer(s) or substrate, as shown in FIG. 4. For example, the opening may extend to the lower electrode 102 shown in FIGS. 1A and 2A.

After completion of the further etching of the openings 81, the masking layer 134 is removed from the sidewalls of the openings 81. If the masking layer 134 comprises an amorphous carbon masking layer, then the step of removing the masking layer from the sidewall may comprise ashing the amorphous carbon masking layer. Alternatively, for other masking layer 134 materials, the step of removing the masking layer from the sidewall may comprise selectively wet etching the masking layer 134 without removing the other layers 19, 121 of the stack. This completes the formation of the memory openings 81.

The completed memory openings 81 composed of upper portions 81a and lower portions 81b are shown in FIG. 5E. The openings 81 extend at least to the lower etch stop layer 122 or through the lower etch stop layer 122. The hard mask layer 124 may be partially or fully consumed during the etching of the lower portions 81b of the openings 81, as shown in FIG. 5E.

An array of memory openings 81 (i.e., front side openings) is formed in locations where the memory film and vertical channels of NAND strings will be subsequently formed, as shown in FIG. 4. For example, if layers 121 comprise a control gate material, such as doped polysilicon, then the etching of the memory openings 81 patterns layers 121 into control gates 3. The memory film (e.g., blocking dielectric 7, charge storage region 9 and tunnel dielectric layer 11) and the channels 1 are then deposited into the memory openings 81 to complete the memory levels of the NAND strings, as shown in FIG. 4. Specifically, the blocking dielectric 7 is formed in the at least one opening 81, the charge storage material layer 9 is formed over the blocking dielectric 7, the tunnel dielectric layer 11 is formed over the charge storage material layer 9, and the semiconductor channel 1 is formed over the tunnel dielectric layer 11 in the at least one opening 81. If desired, the insulating fill layer 2 may also be deposited into the memory openings, as shown in FIG. 2A.

FIGS. 6A-6F illustrate a method of making a high aspect ratio opening in a stack of alternating layers using sidewall spacer passivation of the opening according to a second embodiment of the disclosure.

FIG. 6A illustrates the same stack 120 of alternating layers of a first material 19 and a second material 121 as in FIG. 5A. The stack may also contain the optional lower etch stop 122 and hard mask 124 layers as in FIG. 5A. However, the intermediate etch stop layer 132 is preferably omitted in the stack shown in FIG. 6A.

Then, as shown in FIG. 6B, the stack 120 is etched to form at least one memory opening 81 in the stack 120. The at least one opening 81 preferably comprises a plurality of openings 81 formed by a method similar to the method described above with respect to FIG. 5B. However, the openings 81 in FIG. 6B differ from the openings 81*a* in FIG. 5B in that they extend through the entire stack 120, such as to the etch stop layer 122 under the stack, and in that the openings 81 are preferably tapered openings having an upper portion 81*a* which is wider than a lower portion 81*b*. The openings 81 may be formed by RIE through openings 181 in the patterned hard mask 124.

As shown in FIG. 6C, a masking layer 234 is formed on a sidewall of the upper portion 81*a* of the at least one opening 81 in the upper portion 120*a* of the stack 120. Layer 234 is also formed on the upper surface of the stack 120. The lower portion 81*b* of the at least one opening 81 is not covered by the masking layer 234. Preferably, layer 234 comprises a non-conformal sidewall spacer because it does not cover the sidewall of the lower portion 81*b* of the opening 81. This non-conformal layer 234 may be referred to as a "semi-conformal" layer because it covers the hard mask 124 and upper portion 81*a* of the opening 81. Layer 234 may be made of any suitable protective material, such as amorphous carbon, silicon nitride, silicon oxide, metal oxide or metal nitride (e.g., $HfO_x$, $TaO_x$, $AlO_x$, $AlN_x$, etc.). Layer 234 deposition is tuned so that the thickness drops from a finite value (e.g., 3-50 nm in the upper portion 81*a* of the memory opening 81) to zero or near-zero thickness in the lower portion 81*b* of the opening 81. Preferably, layer 234 thickness drops to zero or below 1 nm between 50% and 75% of the depth of the opening 81, such as at about 65-68% depth of the etched opening 81. In other words, the lower portion 81*b* of the opening 81 comprises the lower 25 to 50% of the opening, such as the lower third of the opening 81 in the lower portion 120*b* of the stack 120.

As shown by the arrows in FIGS. 6D and 6E, an over etch step is then used to widen the critical diameter of the lower portion 81*b* of the opening 81 that is not protected by layer 234. Specifically, the over etch comprises further etching the lower portion 81*b* of the at least one opening 81 to widen the lower portion 81*b* of the at least one opening while the masking layer 234 remains on the sidewall of the upper portion 81*a* of the at least one opening 81. Thus, layers 19 and 121 (e.g., control gates) in the upper portion 120*a* of the stack are protected by layer 234 from further etching while the layers 19 and 121 in the lower portion 120*b* of the stack are further etched in the step shown in FIGS. 6D and 6E. The further etching step shown in FIGS. 6D and 6E may comprise an RIE step and/or a wet etching (e.g., wet clean) step.

After completion of the further etching of the openings 81, the masking layer 234 is removed from the sidewalls of the openings 81, as shown in FIG. 6F. If the masking layer 234 comprises an amorphous carbon masking layer, then the step of removing the masking layer from the sidewall may comprises ashing the amorphous carbon masking layer. Alternatively, for other masking layer 234 materials, the step of removing the masking layer from the sidewall may comprise selectively wet etching the masking layer 234 without removing the other layers 19, 121 of the stack. This completes the formation of the memory openings 81.

The completed memory openings 81 composed of upper portions 81*a* and lower portions 81*b* are shown in FIG. 6F. The openings 81 extend at least to the lower etch stop layer 122 or through the lower etch stop layer 122. The hard mask layer 124 may be partially or fully consumed during the etching of the lower portions 81*b* of the openings 81, as shown in FIG. 6F.

An array of memory openings 81 (i.e., front side openings) is formed in locations where the memory film and vertical channels of NAND strings will be subsequently formed, as shown in FIG. 4. For example, if layers 121 comprise a control gate material, such as doped polysilicon, then the etching of the memory openings 81 patterns layers 121 into control gates 3. The memory film (e.g., blocking dielectric 7, charge storage region 9 and tunnel dielectric layer 11) and the channels 1 are then deposited into the memory openings 81 to complete the memory levels of the NAND strings, as shown in FIG. 4. Specifically, the blocking dielectric 7 is formed in the at least one opening 81, the charge storage material layer 9 is formed over the blocking dielectric 7, the tunnel dielectric layer 11 is formed over the charge storage material layer 9, and the semiconductor channel 1 is formed over the tunnel dielectric layer 11 in the at least one opening 81. If desired, the insulating fill layer 2 may also be deposited into the memory openings, as shown in FIG. 2A.

FIGS. 7A-7F show alternative steps of the method of the second embodiment. In this method, an additional hard mask layer is formed over the masking layer 234.

FIG. 7A illustrates the same stack 120 of alternating layers of the first material 19 and the second material 121 as in FIG. 6A. The stack may also contain the lower etch stop 122 and hard mask 124 layers as in FIG. 6A. Then, as shown in FIG. 7B, the stack 120 is etched to form at least one memory opening 81 in the stack 120 using RIE, similar to the step described above with respect to FIG. 6B. The RIE step is followed by stripping the hard mask layer 124 by ashing or selective wet etching.

As shown in FIG. 7C, the masking layer 234 is formed on a sidewall of the upper portion 81*a* of the at least one opening 81 in the upper portion 120*a* of the stack 120, similar to the step described above with respect to FIG. 6B. Layer 234 is also formed on the upper surface of the stack 120.

Then, as shown in FIG. 7D, an additional hard mask 244 is formed over a portion of the masking layer 234 located over the upper surface of the stack 120. The hard mask 244 is formed non-conformally such that it is formed only on the upper surface of the stack 120, but not in the openings 81. This forms hard mask openings 181 in the hard mask 244. The hard mask 244 may comprise an amorphous carbon hard mask.

The method then proceeds similar to the method illustrated in FIGS. 6D-6F. Specifically, the lower portion 81*b* of the at least one opening 81 is etched through the openings 181 in the additional hard mask 244 to widen the lower portion 81*b* of the at least one opening 81, as shown in FIG. 7E. Finally, as shown in FIG. 7F, layer 234 and the hard mask 244 are removed similar to the step described above with respect to FIG. 6F.

In the above methods, amorphous carbon hard mask shape may be improved by an optional flash step. This may improve the masking layer deposition and memory opening profile.

The first and second embodiments described above contain doped semiconductor layers 121 which form the control gates 3 of the NAND strings, as shown in FIG. 4. In alternative embodiments layers 121 may be sacrificial layers which are removed and replaced by conductive control gates 3, as shown in FIGS. 8A-8E.

A portion of the stack 120 containing insulating first layers 19 (e.g., 19*a*, 19*b*, etc.) and sacrificial second layers 121 (e.g., 121*a*, 121*b*, etc.) is shown in FIG. 8A. The front side opening (i.e., the memory opening 81) is formed in the stack 120 using the method of the first or the second embodiment described above.

Next, in an optional step as shown in FIG. 8B, the second material 121 is selectively etched compared to the first material 19 to form front side recesses 62 in the second material 121 (i.e., layers 121*a*, 121*b*, etc). The recesses 62 may be formed by selective, isotropic wet or dry etching which selectively etches the second material 121 compared to the first material 19. The depth of each recess 62 may be 3 to 20 nm. This step may be omitted if desired.

As shown in FIG. 8C, a plurality of discrete semiconductor, metal or silicide charge storage regions 9 are selectively formed on portions of the second material layers 121 exposed in the front side opening 81. The charge storage regions 9 comprise a plurality of charge storage segments or regions (e.g., 9a and 9b) located on the exposed edges of the second material 121 in the front side recesses 62.

In one embodiment, the charge storage regions 9 are selectively formed by selective growth of the regions on the exposed edges of the semiconductor second material layers 121 but not on the exposed insulating first material layers 19. Any suitable selective growth methods may be used to form the charge storage regions 9, such as chemical vapor deposition.

In one aspect of the selective growth embodiment, charge storage regions 9 comprise doped polysilicon regions which are selectively grown by CVD on the portions of the undoped or intrinsic second material layers 121 (e.g., undoped or intrinsic semiconductor having a polycrystalline or amorphous structure, such as polysilicon, amorphous silicon, silicon germanium or germanium) exposed in the front side opening 81. For example, the doped polysilicon regions 9 may comprise boron doped, p-type polysilicon regions (e.g., lightly or heavily doped) which are selectively, epitaxially grown on polysilicon layer 121 edges exposed in the front side openings 81. The doped polysilicon regions 9 are not grown on portions of the first material layers 19 (e.g., silicon oxide) exposed in the front side opening 81.

Any suitable silicon selective epitaxial growth (SEG) conditions may be used to form regions 9. For example, a chemical vapor deposition (CVD) SEG process which combines a silicon source gas and a silicon growth inhibitor gas which inhibits silicon growth on the oxide layers 19 may be used. Exemplary silicon source gases include silane and chlorosilanes (e.g., $SiH_4$, $SiH_2Cl_2$, and/or $SiHCl_3$). Exemplary inhibitor gases which inhibit silicon growth on $SiO_2$ include HCl and/or $Cl_2$. $H_2$ may be used as a carrier gas while $B_2H_6$, $AsH_3$ and/or $PH_3$ gases may be added to introduce dopants to the silicon regions 9. Any suitable SEG temperatures and pressures may be used, such as a temperature of 500 to 800 C and a pressure of 10 mTorr to 100 Torr (i.e., LPCVD). Similar process conditions may be used to form germanium or silicon-germanium charge storage regions 9, where germane ($GeH_4$) is substituted for silane or provided in addition to silane, at lower temperatures (e.g., 340 to 380 C) and pressure of about 10 mTorr-5 Torr, such as about 1 Torr.

In another aspect of the selective growth embodiment, charge storage regions 9 comprise selectively grown metal or silicide charge storage regions, such as on the portions of the second material layers exposed in the front side opening. Any metal (i.e., pure metal or conductive metal alloy) or metal silicide which may be selectively grown on exposed semiconductor layer 121 in the opening 81 may be used. For example, the charge storage regions 9 may comprise selectively grown tungsten, molybdenum or tantalum regions that are selectively grown on the semiconductor material (e.g., silicon) 121 but not on insulating material (e.g., silicon oxide) 19 from a metal halide source gas (e.g., tungsten hexafluoride) in a CVD process.

Selective deposition of refractory metals, such as W, Mo or Ta, on silicon may be performed by metal halide source gas reduction by $SiH_4$, where a ratio of $SiH_4$ to metal halide is less than one. For example, as disclosed in U.S. Pat. Nos. 5,084,417 and 5,807,788, incorporated herein by reference in their entirety, in the selective CVD process, the metal halide source gas may comprise $WF_6$, $MoF_6$ or $TaCl_5$ and the deposition temperature and pressure may range from 370 to 550 C and 100 to 500 mTorr, respectively. The ratio of the $SiH_4$/metal halide flow rates may range between 0.4 and 0.6.

If the front side recesses 62 are present, then the regions 9 may be selectively grown in the front side recesses 62 until their edges are about even with the edges of the insulating material 19 such that they form a relatively straight sidewall of the front side opening 81 (e.g., as much as a timed selective growth permits). Alternatively, the selective growth of regions 9 is terminated before regions 9 completely fill the recesses 62. Thus, regions 9 may partially fill recesses 62 and may remain horizontally recessed in the opening 81 compared to insulating material layers 19. Alternatively, the selective growth of regions 9 is terminated after regions 9 completely fill the recesses 62 such that the regions 9 protrude horizontally into the front side opening 81 past layers 19, as shown in FIG. 8C.

In another embodiment, the regions 9 are selectively formed by doping of the semiconductor layers 121 exposed in the front side opening 81. For example, when layers 121 comprise intrinsic or undoped semiconductor layers, a timed gas phase diffusion doping may be carried out to dope the edge portions 9 of layers 121 facing the opening 81 by providing a doping gas through the opening 81. The doping is terminated before the entire volume of layers 121 are doped, such that portions of layers 121 located behind regions 9 and facing away from the opening 81 remain undoped. For example, for Group IV semiconductor material (e.g., silicon) layers 121, the doping gas may comprise a boron containing gas, such as diborane, to form p-type doped regions 9, or a phosphorus or arsenic containing gas, such as phosphine or arsene, to form n-type doped regions 9.

In the next step shown in FIG. 8C, a tunnel dielectric layer 11 is deposited over the charge storage regions 9a, 9b and the insulating first material layers 19 between the charge storage regions in the front side opening 81. Then, the channel 1 is formed by depositing channel material 1, such as a lightly doped or intrinsic polysilicon over the tunnel dielectric layer 11 in the front side opening 81. If desired, a high temperature anneal may be performed after forming the channel.

As discussed above, the entire opening 81 may be filled to form the device illustrated in FIGS. 2A and 2B. Alternatively, a layer of channel material may first be deposited in the opening 81 followed by deposition of an insulating fill material 2 to form the device illustrated in FIGS. 1A and 1B. If desired, the channel 1 may be U-shaped as illustrated in FIG. 3.

The channel 1 may be formed by filling the front side opening 81 with a lightly doped semiconductor material (e.g., polysilicon) and then etched back from the top to form the pillar shaped (or U-shaped) channel 1 in the opening 81. In the embodiment of FIG. 3, the space between the wings of the U-channel 1 is filled with a gap fill insulating layer 103, such as silicon oxide or another material. Layer 103 may be formed by etching the stack 120 to form a rail shaped cut, followed by depositing an oxide layer followed by etch back or chemical mechanical polishing to form a planar top surface exposing the top surfaces of the channels 1. The channels are then connected to source and drain electrodes 102, 202 as shown in FIGS. 1-3, the select gate electrodes (not shown for clarity) are connected to select gate contacts and the control gate electrodes 3 are connected to word line contacts as known in the art.

In the next step shown in FIG. 8D, the stack 120 is patterned to form one or more back side openings 84 in the stack. The back side opening(s) 84 may be formed by photolithography and anisotropic etching of the stack. Preferably, the opening(s) 84 have a slit trench shape.

Then, at least a portion of the second material layers 121 are removed through the back side opening 84 to form back side recesses 64 between the first material layers 19. For example, layers 121 may be removed completely by selective wet etching using a liquid etching medium which selectively etches the material of layers 121 compared to the materials of layers 19 and regions 9. For example, if layers 121 comprise undoped or intrinsic polysilicon, layers 19 comprise silicon oxide and regions 9 comprise doped polysilicon, silicide or metal, then an undoped polysilicon selective etch may be used which stops on doped polysilicon (e.g., p-type polysilicon) regions 9 which act as an etch stop. Alternatively, the selective etch may be a timed etch which is timed to remove only a portion of the sacrificial second material layers 121 through the back side opening 84. In this case, a remaining portion of the second material layers 121 rather than regions 9 remain exposed in the back side recesses 64.

Then, as shown in FIG. 8E, the blocking dielectric layer 7 (also known as an inter-poly dielectric, IPD) is then formed in the back side recesses 64 through the back side opening 84 such that the blocking dielectric coats the sides of the back side recesses 64 and the back side of layers 19 exposed in the back side opening 84. The blocking dielectric layer 7 may comprise a silicon oxide layer deposited by conformal atomic layer deposition (ALD) or chemical vapor deposition (CVD). Other high-k dielectric materials, such as hafnium oxide, aluminum oxide, or multi-layer dielectrics (e.g., ONO) may be used instead or in addition to silicon oxide. Optionally, an insulating capping layer (e.g., silicon nitride) may be deposited into the openings before the blocking dielectric 7 and may comprise a back portion of a multi-layer blocking dielectric. The blocking dielectric 7 may have a thickness of 6 to 20 nm. An optional anneal, such as a rapid thermal anneal, may be conducted after the blocking dielectric formation.

The blocking dielectric layer 7 comprises a plurality of clam-shaped blocking dielectric segments 7a, 7b in the back side recesses 64 connected to each other by vertical portions 7c of the blocking dielectric layer 7 located on the exposed edges of the first material layers 19 in the back side opening 84. As used herein a "clam" shape is a side cross sectional shape configured similar to an English letter "C". A clam shape has two segments which extend substantially parallel to each other and to the major surface 100a of the substrate 100. The two segments are connected to each other by a third segment which extends substantially perpendicular to the first two segments and the surface 100a. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments and having a fourth side open.

The opening in the clam shaped blocking dielectric segments is then filled by a control gate 3 material. As described above, the control gate material may comprise a thin barrier layer/adhesion layer such as titanium nitride or tungsten nitride and metal, such as tungsten or a combination of tungsten and titanium nitride layers. The control gate material may be deposited by CVD and fills the remaining volume of the back side recesses 64 inside the clam shaped blocking dielectric 7 segments and the entire back side opening 84. The deposition of the control gate material is followed by etching the control gate material to remove it from the back side opening 84 using anisotropic etching, while leaving the control gate material inside the back side recesses 64 in the clam shaped blocking dielectric 7 segments. The remaining control gate material inside the back side recesses 64 forms the control gates 3 of the vertical NAND string.

While the formation of the high aspect ratio openings was described above with respect to forming memory openings 81 for a vertical NAND string, the methods described above may be applied to any other suitable device. For example, the methods of the first or the second embodiments described above may be used to form any high aspect ratio opening, such as trenches, slits, holes, spaces between mesas or pillars, or other three-dimensional shapes in any memory, logic or other semiconductor device.

In general, the methods of the present disclosure can be practiced with various structures including a stack of layers comprising a first material and a second material. In an illustrative example, referring to FIGS. 5A, 6A, and 7A, the stack (19, 121) can include a first material embodied in the first layers 19 and a second material embodied in the second layers 121. In another example, referring to FIG. 8A, the stack (19a, 121a, 19b, 121b, . . . ) can include a first material embodied in the first layers (19a, 19b) and a second material embodied in the second layers (121a, 121b).

A hard mask layer 124 (See FIGS. 5A, 6A, 7A, and 8A) can be formed over the stack. The hard mask layer 124 can be patterned to form at least one hard mask opening within which a top surface of the stack is exposed. Subsequently, the stack can be etched through the at least one hard mask opening.

An opening 81 (See FIGS. 5B, 6B, 7B, and 8A) can be formed in the stack employing a first etch process. The first etch process can include a reactive ion etch process, which is an anisotropic etch process. An upper portion 81a (See FIGS. 6B and 7E) of the opening 81 can be wider than a lower portion 81b (See FIGS. 6B and 7E) of the opening 81. A masking layer can be formed on a sidewall of the upper portion 81a of the opening 81 while the lower portion 81b of the opening 81 is not covered by the masking layer. In one embodiment, the masking layer can include the masking layer 234 illustrated in FIG. 6C. In another embodiment, the masking layer can be the hard mask layer 244 illustrated in FIG. 7D. The masking layer can be formed over an upper surface of the hard mask layer 124 in addition to the sidewall of the upper portion of the opening.

Subsequently, the stack can be laterally recessed around the lower portion 81b by a second etch process, while the masking layer (234 or 244) remains on the sidewall of the upper portion 81a of the opening 81. The second etch process can be performed to etch the lower portion of the stack while the masking layer protects an upper portion of the stack.

Figure 9A:
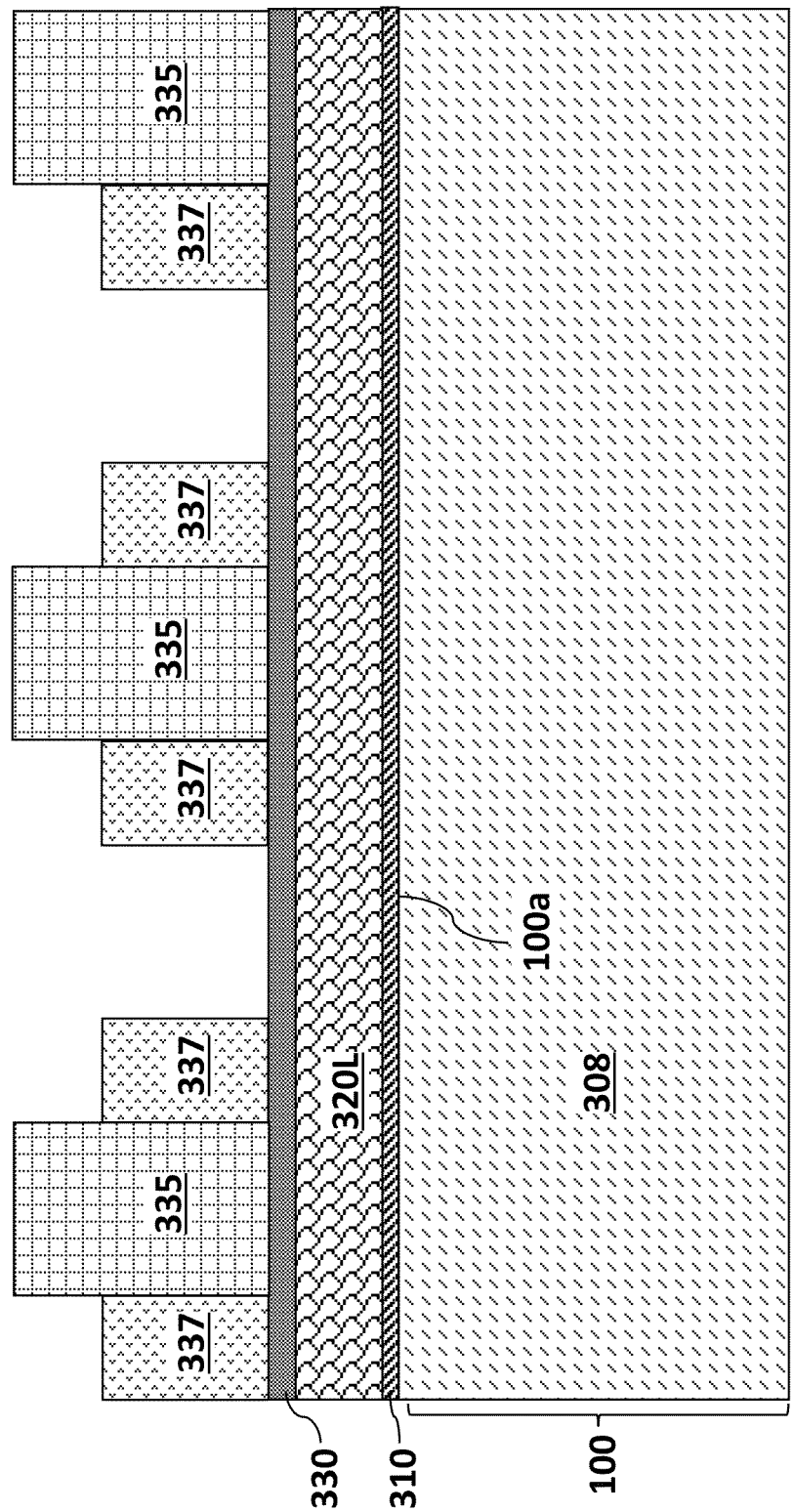

In one embodiment of the present disclosure, a horizontal NAND string having a negative offset between sidewalls of floating gates and sidewalls of channels can be formed. Referring to FIG. 9A, an exemplary device structure according to an embodiment of the present disclosure includes a stack of layers comprising a first material embodied as a charge storage material layer 320L, a tunnel dielectric layer 310, and a second material embodied as a semiconductor material layer 308 located within a substrate 100. The substrate 100 can include a semiconductor material layer 308 (which can include a portion of a semiconductor channel having a doping of a first conductivity type) and a source region of a NAND string embedded within the semiconductor material layer 308 and having a doping of a second conductivity type that is the opposite of the first conductivity type. The stack (308, 310, 320L) of layers can be arranged in the following order in a first direction extending transverse to a major surface 100a of a substrate 100. The order of the layers can be a semiconductor material layer 308, a tunnel dielectric layer 310, a charge storage material layer 320L, and a dielectric material layer 330 (if present).

Optionally, additional material layers (not shown) may be present underneath the substrate 100. The substrate 100 can be a bulk semiconductor substrate, in which case the entirety of the substrate 100 is a semiconductor substrate. Alternatively, the substrate 100 can be a top semiconductor layer of a semiconductor-on-insulator (SOI) substrate or a top semiconductor material portion a hybrid substrate including at least one bulk semiconductor region and at least one SOI region. In this case, the semiconductor material layer 308 can be the top semiconductor layer of an SOI substrate, a semiconductor material layer in a bulk portion, or a top semiconductor portion in an SOI region of a hybrid substrate.

The semiconductor material layer 308 is a semiconductor material layer, and can include at least one elemental semiconductor material (e.g., silicon), at least one III-V compound semiconductor material, at least one II-VI compound semiconductor material, at least one organic semiconductor material, or other semiconductor materials known in the art. The substrate 100 has a major surface 100a, which can be, for example, a topmost surface of the semiconductor material layer 308. The major surface 100a can be a semiconductor surface. In one embodiment, the major surface 100a can be a single crystalline semiconductor surface.

A semiconductor material has resistivity in the range from $1.0 \times 10^{-5}$ Ohm-cm to $1.0 \times 10^{5}$ Ohm-cm, and is capable of producing a doped material having a resistivity in a range from $1.0 \times 10^{-5}$ Ohm-cm to 1.0 Ohm-cm upon suitable doping with an electrical dopant. As used herein, an "electrical dopant" refers to a p-type dopant that adds a hole to a balance band within a band structure, or an n-type dopant that adds an electron to a conduction band within a band structure.

The semiconductor material layer 308 can include a single crystalline semiconductor material, a polycrystalline semiconductor material, and/or an amorphous semiconductor material. In one embodiment, the semiconductor material layer 308 can be a single crystalline semiconductor material layer. In one embodiment, the semiconductor material layer 308 can include a single crystalline silicon layer, a single crystalline silicon-germanium alloy layer, or a single crystalline silicon-carbon alloy layer. Alternately or additionally, the semiconductor material layer 308 can include a polycrystalline silicon layer, a polycrystalline silicon-germanium alloy layer, or a polycrystalline silicon-carbon alloy layer. Portions of the semiconductor material layer 308 can be suitably doped with p-type dopants (e.g., the semiconductor layer 308 may be a p-well region in the substrate 100) or n-type dopants.

The tunnel dielectric layer 310 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 310 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 310 can include a stack of a first silicon oxide layer, a silicon oxynitride layer, and a second silicon oxide layer, which is commonly known as an ONO stack. In one embodiment, the tunneling dielectric layer 310 can include a silicon oxide layer that is substantially free of carbon or a silicon oxynitride layer that is substantially free of carbon. The tunnel dielectric layer 310 can be formed, for example, by atomic layer deposition (ALD), chemical vapor deposition (CVD), thermal and/or plasma conversion of a surface portion of the semiconductor material layer 308, and/or other conformal or non-conformal deposition methods for depositing a suitable dielectric material as known in the art. The thickness of the tunnel dielectric layer 310 can be in a range from 2 nm to 20 nm, although lesser and greater thicknesses can also be employed.

The charge storage material layer 320L includes a dielectric charge trapping material, which can be, for example, silicon nitride, or a conductive material such as doped polysilicon or a metallic material. In one embodiment, the charge storage material layer 320L can include a semiconductor material, which can include at least one elemental semiconductor material, at least one III-V compound semiconductor material, at least one II-VI compound semiconductor material, at least one organic semiconductor material, and/or other semiconductor materials known in the art. The semiconductor material of the charge storage material layer 320L can be polycrystalline or amorphous, and can be p-doped, n-doped, or intrinsic. In an illustrative example, the charge storage material layer 320L can include polysilicon or amorphous silicon. The thickness of the charge storage material layer 320L can be in a range from 10 nm to 150 nm, although lesser and greater thicknesses can also be employed. In another embodiment, the charge storage material layer 320L can include a metallic material. The metallic material can include one or more of an elemental metal, an intermetallic alloy of at least two elemental metals, a conductive nitride of at least one elemental metal, a metal-semiconductor alloy such as metal silicide, and a combination or an alloy thereof. For example, the metallic material can be titanium nitride or tantalum nitride. In yet another embodiment, the charge storage material layer 320L can include silicon nitride that can trap electrical charges.

The charge storage material layer 320L can be formed as a single charge storage material layer of homogeneous composition, or can include a stack of multiple charge storage material layers. The multiple charge storage material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage material layer 320L may comprise an insulating charge trapping material, such as one or more silicon nitride segments. Alternatively, the charge storage material layer 320L may comprise conductive nanoparticles such as metal nanoparticles, which can be, for example, ruthenium nanoparticles. The charge storage material layer 320L can be formed, for example, by chemical vapor deposition (CVD), atomic layer deposition (ALD), physical vapor deposition (PVD), or any suitable deposition technique for the selected material(s) for the charge storage material layer 320L. The thickness of the charge storage material layer 320L can be in a range from 2 nm to 100 nm, although lesser and greater thicknesses can also be employed.

A dielectric material layer 330 can be optionally deposited over the charge storage material layer 320L. In one embodiment, the dielectric material layer 330 can be a hard mask layer that is patterned by a combination of lithographic methods and an etch process prior to patterning of the underlying material layers (i.e., the charge storage material layer 320L and the tunnel dielectric layer 310) and employed as an etch mask in a subsequent etch process. The dielectric material layer 330 can include silicon nitride, silicon oxide, a dielectric metal oxide, a dielectric metal oxynitride, or a combination thereof. In one embodiment, the dielectric material layer 330 can include silicon nitride and/or silicon oxide. The dielectric material layer 330 can be formed by a conformal or non-conformal deposition process such as chemical vapor deposition (CVD). The thickness of the dielectric material layer 330 can be in a range from 5 nm to 50 nm, although lesser and greater thicknesses can also be employed.

A photoresist layer 335 can be applied over the dielectric material layer 330. An organic or inorganic planarizing material layer and/or an antireflective coating layer may be formed below, or above, the photoresist layer 335. The photoresist layer 335 can be patterned by lithographic exposure and development.

In one embodiment, a hard mask layer 337 can be formed as spacer structures by deposition of a conformal material layer and an anisotropic etch that removes horizontal portions of the conformal material layer. The remaining horizontal portions of the conformal material layer after the anisotropic etch constitute the hard mask layer 337. The conformal material layer can be deposited, for example, by chemical vapor deposition. The hard mask layer 337 can include a material such as amorphous carbon, diamond-like carbon (DLC), or low temperature oxide (which is silicon oxide including hydrogen and can be deposited at a temperature less than 200 degrees Celsius). The patterned photoresist layer 337 can be removed, for example, by ashing. The use of the combination of the photoresist layer 335 and the hard mask layer 337 can provide the benefit of pitch doubling.

Alternatively, formation of the hard mask layer 337 can be omitted and the photoresist layer 335 can be patterned directly with the pattern to be subsequently transferred through the dielectric material layer 330, the charge storage material layer 320L, the tunnel dielectric layer 310, and the upper portion of the semiconductor material layer 308. Yet alternately, multiple rounds of pitch doubling techniques may be employed to decrease the lateral dimensions of the trenches to be subsequently formed through the through the dielectric material layer 330, the charge storage material layer 320L, the tunnel dielectric layer 310, and the upper portion of the semiconductor material layer 308.

The hard mask layer 337 (or the pattern in a patterned photoresist layer if the pattern in the patterned photoresist layer is to be directly transferred to underlying layers in subsequent processing steps) can have a pattern defined by the at least one opening 81 therein. The pattern of the at least one opening 81 can be selected to form suitable device structures from the patterned portions of the charge storage material layer 320L, the tunnel dielectric layer 310, and an upper portion of the semiconductor material layer 308 by at least one anisotropic etch to form at least one opening 81. In one embodiment, the at least one opening 81 in the hard mask layer 337 can be a contiguous opening that isolated patterned portions of the photoresist layer into disjoined discrete material portions having horizontal cross-sectional shapes that are closed shapes. As used herein, a "closed" shape refers to a two-dimensional shape that is defined by a contiguous periphery that begins and ends at a same point without crossing itself, i.e., a shape defined by a periphery that can be traced throughout the entirety of the periphery to come back to the starting point without crossing any portion of the periphery during the tracing.

In one embodiment, the patterned portions of the photoresist layer can have substantially cylindrical shapes or substantially elliptic cylindrical shapes. A substantially cylindrical shape is a shape that does not deviate from a cylindrical shape by more than surface roughness or other variations introduced during normal patterning processes known in the art. A substantially elliptic cylindrical shape is a shape that does not deviate from an elliptic cylindrical shape by more than surface roughness or other variations introduced during normal patterning processes known in the art.

Figure 9B:
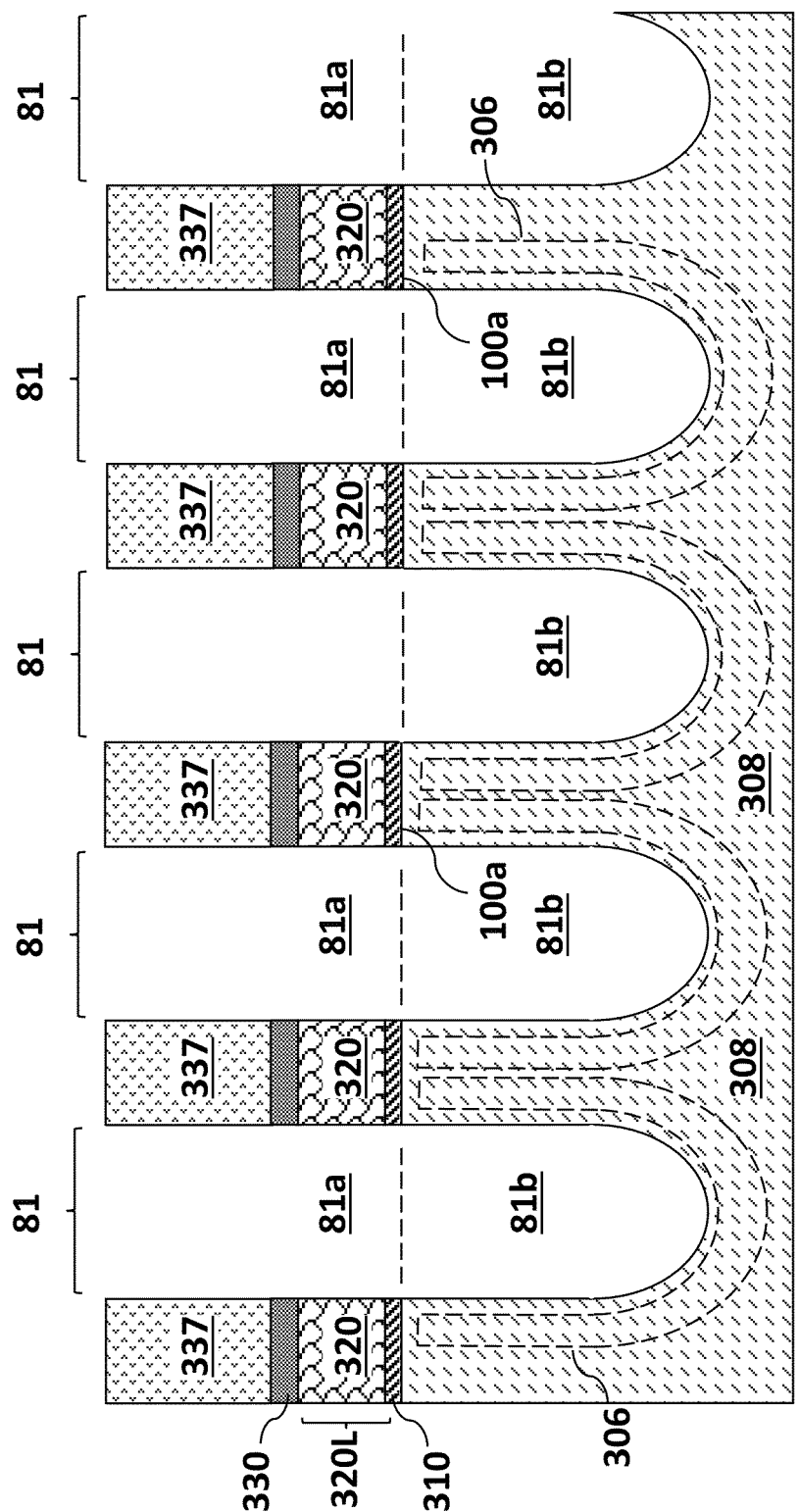

In another embodiment, the patterned portions of the photoresist layer can have a horizontally extending shape, i.e., a shape that extends along a horizontal direction with a substantially same vertical cross-sectional shape. For example, the hard mask layer 337 can extend along the direction that is perpendicular to the vertical plane of the cross-sectional view of FIG. 9B.

The pattern in the hard mask layer 337 can be transferred through the dielectric material layer 330, the charge storage material layer 320L, the tunnel dielectric layer 310, and an upper portion of the semiconductor material layer 308 by at least one anisotropic etch to form at least one opening 81. In one embodiment, the hard mask layer 337 can be employed as the etch mask during the at least one anisotropic etch. In another embodiment, the hard mask layer 337 can be consumed during a step of the at least one anisotropic etch, and the patterned portion(s) of the dielectric material layer 330 can be employed as an hard mask layer for etching remaining portions of the stack of the charge storage material layer 320L, the tunnel dielectric layer 310, and the semiconductor material layer 308. In this case, the dielectric material layer 330 is employed as a hard mask layer within which at least one hard mask opening is formed that duplicates the shape(s) of the at least opening in the photoresist layer. A top surface of the underlying stack (308, 310, 320L) can be physically exposed within each of the at least one opening in the hard mask layer. Each patterned portion of the dielectric material layer 330 is herein referred to as a dielectric material layer 330.

The stack of the charge storage material layer 320L, the tunnel dielectric layer 310, and the semiconductor material layer 308 is etched employing at least one etch process, which is herein collectively referred to as a first etch process. The first etch process can be at least one anisotropic etch (such as a reactive ion etch) that employs the hard mask layer 337 and/or the patterned dielectric material layer 330 as at least one etch mask. If patterned dielectric material layer 330 is employed as a hard mask layer during the first etch process, the stack (308, 310, 320L) can be etched through the at least one hard mask opening during the first etch process.

At least one opening 81 is formed in the stack (308, 310, 320L) employing the first etch process. The at least one opening 81 extends through the remaining patterned portions of the dielectric material layer 330, the charge storage material layer 320L, the tunnel dielectric layer 310, and the upper portion of the semiconductor material layer 308. The bottom surface of each of the at least one opening 81 can be concave as illustrated, or can be planar, i.e., can be located within a horizontal plane depending on the etch chemistry employed during the first etch process, which can comprise an anisotropic etch process. Each opening 81 extends in the first direction, i.e., in a horizontal direction that is transverse to the vertical direction, which is the first direction along which the initial material stack (308, 310, 320L) is arranged.

Each remaining portion of the charge storage material layer 320L constitutes charge storage region 320. Thus, the entire set of the charge storage regions 320 constitutes the charge storage material layer 320 as patterned. The remaining portion of the semiconductor material layer 308 includes at least one semiconductor channel 306, which is a contiguous surface portion of the semiconductor material layer 308 that contiguously extends from a region underneath one tunnel dielectric layer 310 to another region underneath another tunnel dielectric layer 310. Each semiconductor channel 306 defines the current path through a horizontal floating gate memory device (such as a horizontal floating gate NAND device).

In one embodiment, a remaining portion of the semiconductor material layer 308 can be a semiconductor material pillar that is laterally surrounded by a lower portion of a contiguous opening 81 and having a horizontal cross-sectional shape that is a closed shape. In this case, the overlying charge storage region 320 can be a charge storage material pillar having a substantially same horizontal cross-sectional area as the upper portion of the semiconductor material pillar. In one embodiment, a charge storage material pillar can have a horizontal cross-sectional shape of a circle or an ellipse, and an underlying semiconductor material pillar can have the same horizontal cross-sectional shape. Thus, the at least one opening 81 can extend into the semiconductor material layer 308 to form at least one semiconductor material pillar made of a remaining portion of the semiconductor material layer 308.

Each opening 81 has a sidewall that includes a sidewall of the semiconductor material layer 308 and a sidewall of the charge storage material layer 320L. An upper portion 81a of an opening 81 located above a horizontal plane including the major surface 100a (e.g., the portion of the opening 81 located above a horizontal plane including the interface between the semiconductor material layer 308 and the tunnel dielectric layer 310) can have the same width as, or can be wider than, a lower portion 81b of the opening located below the horizontal plane including the major surface 100a. While the present disclosure is described employing an embodiment in which sidewalls of the upper portion 81a of an opening 81 are laterally spaced by a same width as underlying sidewalls of the lower portion 81b of the same opening 81, embodiments are expressly contemplated herein in which the sidewalls of the upper portion 81a of an opening 81 are laterally spaced by a greater width than underlying sidewalls of the lower portion 81b of the same opening 81. In such embodiments, the upper portion 81a of an opening 81 can be wider than a lower portion 81b of the opening 81. The sidewalls of the at least one opening 81 can be substantially vertical, or can be tapered.

Figures 9C, 9D:
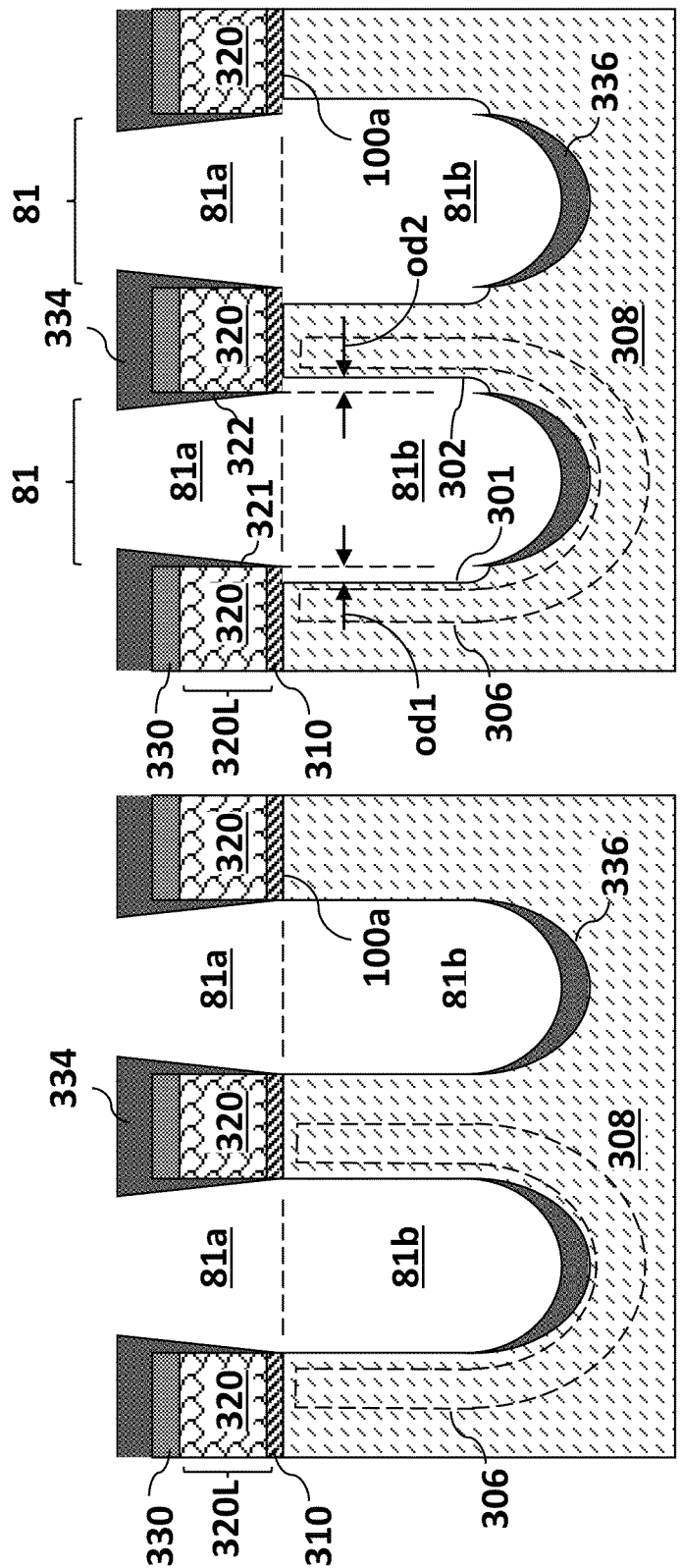

Referring to FIG. 9C, a masking layer 334 is formed on the sidewalls of the upper portion 81a of each opening 81, while the lower portion 81b of each opening 81b is not covered by the masking layer 334. The masking layer 334 can be deposited by a non-conformal deposition method.

In one embodiment, the masking layer 334 can be deposited by a non-conformal chemical vapor deposition (CVD). In a non-conformal CVD process, the deposition rate can be deposited by supply of reactants. The rate of deposition at the topmost surface and portions of sidewalls that are proximal to the topmost surface can be greater than the rate of deposition at portions of sidewalls that are distal from the topmost surface. In this case, the deposition rate at the sidewalls of the upper portion 81a of each opening 81 can be greater than the deposition rate at the lower portion 81b of each opening 81b.

In one embodiment, the masking layer 334 can be formed over the upper surface of a hard mask layer (such as the dielectric material layer 330) and on the sidewalls of the upper portion of each opening 81. Due to the non-conformal nature of the deposition process employed to form the masking layer 334, the masking layer comprises a non-conformal sidewall spacer, which a vertical portion of the masking layer 334 that contacts the sidewalls of a charge storage region 320 and a dielectric material layer 330 (if present), and optionally contacting sidewalls of a tunnel dielectric layer 310. The material of the masking layer 334 is not deposited on the sidewalls of the lower portion 81b of each opening 81 (i.e., on the sidewalls of the semiconductor channels 306). Depending on the deposition process employed, a material may, or may not, be deposited at the bottom surface of an opening 81 during formation of the masking layer 334. If the material is deposited at the bottom surface of at least one opening 81, each deposited material portion at the bottom surface of the at least one opening 81 is herein referred to as a bottom masking material portion 336. The bottom masking material portion 336 can include the same material as the material of the masking layer 334.

Optionally, the deposition process may have at least one built-in isotropic etch-back process to remove any deposited material at the sidewalls of the lower portion 81b of each opening 81. Alternately or additionally, an isotropic etch back process may be performed after the deposition process to remove any deposited material from the sidewalls of the lower portion 81b of each opening 81. Yet alternately, a plurality of deposition processes and etch back processes can be performed to provide a structure in which the sidewalls of the lower portion 81b of each opening do not have any deposited material thereupon. Depending on the anisotropic of the deposition rate during the deposition process and the effectiveness of removal of any deposited material from the bottom surface(s) of the at least one opening 81, a bottom masking material portion 336 may, or may not, be formed.

In one embodiment, the masking layer 334 can be deposited by an angled gas cluster ion beam (GCIB) deposition process in which gas clusters of ion beams including the material to be deposited impinge on the surfaces of the sidewalls of the lower portion 81b of each opening 81. The angle of the beam with respect to the surface normal of the major surface 100a can be selected such that the impinging beam deposits the material of the masking layer 334 only above the horizontal plane including the major surface 100a, and does not deposit any material below the horizontal plane including the major surface 100a. Depending on the angle of the incident beams during the angled GCIB deposition process, a bottom masking material portion 336 may, or may not, be formed.

The masking layer 334 can include any material that can be subsequently removed. For example, the masking layer 334 can comprise a material selected from amorphous carbon, silicon nitride, silicon oxide, metal oxide, and metal nitride. The process for depositing the masking layer 334 is tuned so that the thickness decreases from a finite value (e.g., 3-50 nm) at the top of the upper portion 81a of each opening 81 to zero at the horizontal plane including the major surface 100A. As discussed above, an etch back step or an etch back process can be optionally employed to remove any material of the masking layer from the sidewalls of the lower portion 81b of each opening 81.

The masking layer 334 covers the sidewalls of the charge storage regions 320, which are sidewalls of the charge storage material layer 320L as patterned, while leaving the sidewalls of the semiconductor material layer 308 physically exposed. The bottom surface of each opening 81 may be a recessed surface of the semiconductor material layer 308, or may be a top surface of a bottom masking material portion 336. In one embodiment, in case the semiconductor material layer 308 includes semiconductor material pillars and the charge storage region 320 includes charge storage material pillars, the masking layer 334 can be formed as discrete material portions that are laterally spaced among one another by the at least one opening 81.

Referring to FIG. 9D, the stack (308, 310, 320) is etched to further widen an unmasked portion of opening 81 including the sidewalls of the semiconductor material layer 308, i.e., the lower portion 81b of the opening 81 on which the masking layer 334 is not present. Specifically, portions of the stack (308, 310, 320) can be laterally recessed around the lower portion 81b of the each opening 81 by a second etch process, while the masking layer 334 remains on the sidewall of the upper portion 81a of the opening 81 and above at least one charge storage region 320. The second etch process can comprise an isotropic etch process or an anisotropic etch process with an isotropic etch component. Specifically, the sidewall of the semiconductor material layer 308 can be laterally recessed by the second etch process, while the masking layer 308 is present on, and protects, an upper portion of the stack (308, 310, 320) including the tunnel dielectric layers 310 and the charge storage regions 320 (which are patterned potions of the charge storage material layer 320L shown in FIG. 9A). In one embodiment, the second etch process can include wet etching or reactive ion etching the semiconductor material layer 308 of the stack (308, 310, 320) exposed in the lower portion 81b of the at least one opening 81, while the masking layer 344 protects the upper portion 81a of the opening 81 from the second etch process.

The sidewalls (321, 322) of the charge storage material layer 320L overhang the laterally recessed sidewalls (301, 302) of the semiconductor material layer 308 by an offset distance (od1, od2) along a direction parallel to the interface between the semiconductor material layer 308 and the tunneling dielectrics 310. Thus, the exemplary device structure includes an opening 81 located in the stack (308, 310, 320) and including a first sidewall, which is herein referred to as a first opening sidewall (301, 321) and a second sidewall, which is herein referred to as a second opening sidewall (302, 322). The first opening sidewall (301, 321) comprises a first sidewall of the semiconductor channel 306, which is herein referred to as a first channel sidewall 301, and a sidewall of a charge storage region 320, which is herein referred to as a first charge storage region sidewall 321. The second opening sidewall (302, 322) comprises a second sidewall of the semiconductor channel 306, which is herein referred to as a second channel sidewall 302, and a sidewall of another charge storage region 320, which is herein referred to as a second charge storage region sidewall 322. The first charge storage region sidewall 321 and the second charge storage region sidewall 322 may be a single sidewall of the same charge storage region 320, or can be disjoined (not directly connect to each other) sidewalls of two different and distinct charge storage regions 320 depending on the shapes of the charge storage regions 320. Likewise, the first channel sidewall 301 and the second channel sidewall 302 may be a single sidewall of the same semiconductor channel 306, or can be sidewalls of two different semiconductor channels 306.

In one embodiment, the first channel sidewall 301 is overhung by the first charge storage region sidewall 321 by a first offset distance od1. As used herein, a first element is "overhung" by a second element if a sidewall of the first element is laterally recessed from a sidewall of the second element such that the second element protrudes out of a vertical plane including the sidewall of the first element. Further, the second channel sidewall 302 is overhung by the second charge storage region sidewall 322 by the second offset distance od2. In one embodiment, the second offset distance od2 can be the same as the first offset distance od1. The first channel sidewall 301 can be a first sidewall of the lower portion 81b of the opening 81, the first charge storage region sidewall 321 can be a first sidewall of the upper portion 81a of the opening 81, the second channel sidewall 302 can be a second sidewall of the lower portion 81b of the opening 81, and the second charge storage region sidewall 322 can be a second sidewall of the upper portion 81a of the opening 81. The first offset distance od1 and the second offset distance od2 can be measured in a second direction transverse to the first direction, i.e., in a horizontal direction that is transverse to the vertical direction, which is the first direction along which the initial material stack (308, 310, 320L) is arranged.

The first offset distance od1 and the second offset distance od2 are substantially greater than atomic level surface roughness present in any of the sidewalls of the opening 81. In one embodiment, each of the first offset distance od1 and the second offset distance od2 can be greater than 1 nm. In another embodiment, each of the first offset distance od1 and the second offset distance od2 can be greater than about 2 nm. In yet another embodiment, each of the first offset distance od1 and the second offset distance od2 can be greater than about 5 nm. In still another embodiment, each of the first offset distance od1 and the second offset distance od2 can be in a range from 5 nm to 30 nm. In even another embodiment, each of the first offset distance od1 and the second offset distance od2 can be in a range from 10 nm to 30 nm.

In one embodiment, a vertical plane including the first channel sidewall 301 can be locally parallel to another vertical plane including the first charge storage region sidewall 321. As used herein, a vertical plane is a plane derived from a two dimensional curve on a horizontal plane by extending the shape of the two dimensional curve along the vertical direction indefinitely. As used herein, a first vertical plane and a second vertical plane are locally parallel to each other if a first two-dimensional vertical plane that tangentially or fully contacts the first vertical plane is parallel to a second two-dimensional vertical plane that tangentially or fully contacts the second vertical plane. The nearest distance between the two vertical planes can be uniform throughout the surface of the first channel sidewall 301, and can be the same as the first offset distance od1. Likewise, a vertical plane including the second channel sidewall 302 can be locally parallel to another vertical plane including the second charge storage region sidewall 322. The nearest distance between the two vertical planes can be uniform throughout the surface of the second channel sidewall 302, and can be the same as the second offset distance od2.

In one embodiment, if at least one bottom masking material portions 336 is present on the bottom surface(s) of the at least one opening 81, an isotropic etching may occur around the top periphery of each bottom masking material portion 336. Specifically, a concave step may be formed on the bottommost portion of each recessed sidewalls (301, 302) of the lower portion 81b of the opening(s) 81, and around the periphery of the topmost regions of the bottom masking material portion 336.

Referring to FIG. 9E, the masking layer 334 and the bottom masking material portion(s) 336 can be removed selective to the materials of the semiconductor material layer 308, the charge storage regions 320, and optionally selective to the materials of the tunnel dielectric layers 310 and the portions of the dielectric material layer 330. The masking layer 334 can be removed from the at least one opening 81 by an isotropic etch, anisotropic etch, or ashing. If the masking layer 334 includes an amorphous carbon masking layer, the amorphous carbon masking layer can be removed by ashing. In one embodiment, the masking layer 334 can be removed from the sidewalls of each opening 81 by selectively wet etching the masking layer 334.

Referring to FIG. 9F, an electrically insulating material can be deposited at least in a lower portion 81b of each opening 81 adjacent to the laterally recessed sidewalls (301, 302) of the semiconductor material layer 308 to form at least one shallow trench isolation structure 340. Specifically, the lower portion 81b of each opening 81 is substantially filled with the electrically insulating material. The electrically insulating material can be, for example, silicon oxide, silicon nitride, spin-on glass, a dielectric metal oxide, or a combination thereof. In one embodiment, the electrically insulating material can be silicon oxide. In one embodiment, the electrically insulating material can be deposited such that the entirety of each opening 81 is substantially filled (with or without any cavities therein) with the electrically insulating material. The electrically insulating material can be subsequently planarized, for example, by chemical mechanical planarization (CMP), a recess etch, or a combination thereof, from above the top surface including the top surface of the dielectric material layer 330. Remaining portions of the deposited and planarized electrically insulating material forms the at least one shallow trench isolation structure 340 that fills the volume of the at least one opening 81.

Referring to FIG. 9G, the at least one shallow trench isolation structure 340 can be vertically recessed to physically expose at least one sidewall of each charge storage region 320. The recessing of the top surface(s) of the at least one shallow trench isolation structure 340 can be controlled such that the recessed top surface(s) of the at least one shallow trench isolation structure 340 is located above the horizontal plane including the bottom surfaces of the tunnel dielectric layers 310. In one embodiment, the recessed top surface(s) of the at least one shallow trench isolation structure 340 is located above the horizontal plane including the interface between the charge storage regions 320 and the tunnel dielectric layers 310. The lower portion 81b of each opening 81 (See FIG. 9E) remains substantially filled with the electrically insulating material, which constitutes the at least one shallow trench isolation structure 340.

A blocking dielectric layer 350 can be formed over the upper surface and on a side surface of each charge storage region 320. The blocking dielectric layer 350 may include one or more dielectric material layers that can function as the dielectric material(s) of a control gate dielectric between the charge storage regions 320 and control gate electrodes to be subsequently formed. The blocking dielectric layer 350 can include silicon oxide, a dielectric metal oxide, a dielectric metal oxynitride, or a combination thereof. In one embodiment, the blocking dielectric layer 350 can include a stack of at least one silicon oxide layer and at least one dielectric metal oxide layer. The blocking dielectric layer 350 can be formed by a conformal deposition process such as chemical vapor deposition (CVD) and/or atomic layer deposition (ALD), and/or by deposition of a conformal material layer (such as an amorphous silicon layer) and subsequent conversion of the conformal material layer into a dielectric material layer (such as a silicon oxide layer). The thickness of the blocking dielectric layer 350 can be in a range from 6 nm to 24 nm, although lesser and greater thicknesses can also be employed.

A conductive material layer 360L can be deposited over the blocking dielectric layer 350. The conductive material layer 360L includes a conductive material that can be employed for control gate electrodes to be subsequently patterned from the conductive material layer 360L. In one embodiment, the conductive material layer includes a material selected from an elemental metal, an intermetallic alloy of at least two metals, a doped semiconductor material, a conductive nitride of at least one metal, a conductive oxide of at least one metal, a metal semiconductor alloy, or a combination or a stack thereof. In one embodiment, the conductive material layer can include tungsten and/or titanium nitride.

Referring to FIG. 9H, control gate electrodes 360 can be formed by patterning the conductive material layer, for example, by application and patterning a photoresist layer (not shown) and by transferring the pattern in the photoresist layer though the conductive material layer by an etch such as a reactive ion etch. The control gate electrodes 360 are formed over the blocking dielectric layer 350, and are electrically insulated from the charge storage regions 320 by the blocking dielectric layer 350. The thickness of the blocking dielectric layer 350 can be selected such that the control gate electrodes 360 are capacitively coupled to the charge storage regions 320 through the blocking dielectric layer 350.

Figure 9I:
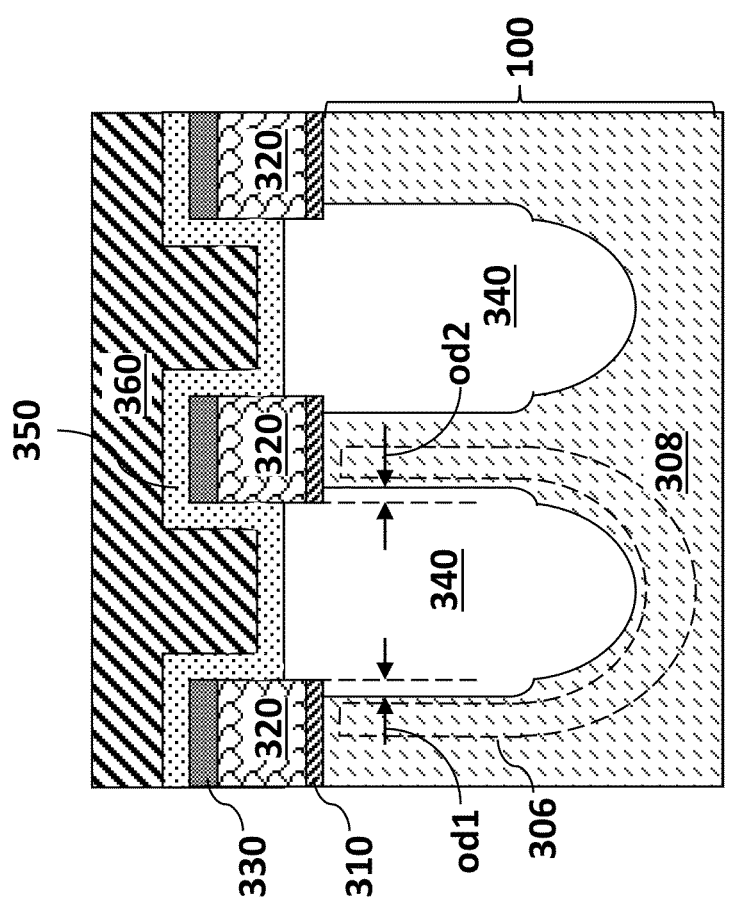
FIG. 9I illustrates an alternative exemplary device structure for a NAND string.

Referring to FIG. 9I, an alternative exemplary device structure can be derived from the exemplary device structure of FIG. 9G by forming the conductive material layer 360L with a greater thickness, and by patterning the conductive material layer 360L with a different pattern so that the control gate electrodes 360 extend along a different horizontal direction.

According to an aspect of the present disclosure, the exemplary device structure can include a semiconductor device that comprises a NAND device, e.g., a NAND string. Each charge storage region 320 can comprises a floating gate of the NAND device. The dielectric material layer 330 can be a silicon nitride layer that is located on an upper surface of the floating gate. Each semiconductor channel 306 can be a silicon channel.

According to another aspect of the present disclosure, the exemplary device structure can be a semiconductor device that comprises a stack (308, 310, 320) of layers arranged in the following order in a first direction extending transverse to a major surface 110a of a substrate 100. The order can be a semiconductor channel 306 are embodied in the semiconductor material layer 308, a tunnel dielectric layer 310, and a charge storage region 320 electrically separated from the semiconductor channel 306 by the tunnel dielectric layer 310. The semiconductor channel 306 has a first side wall, i.e., the first semiconductor channel sidewall 301. The charge storage region 320 has a first side wall, i.e., the first charge storage region sidewall 321. The first sidewall of the semiconductor channel 306 is overhung by the first sidewall of the charge storage region 320 by a first offset distance od1 in a second direction transverse to the first direction, i.e., along a horizontal direction.

According to yet another aspect of the present disclosure, the exemplary device structure can be a semiconductor device comprising a semiconductor material pillar extending in a first direction, which is the vertical direction. The semiconductor material pillar can be a portion of the semiconductor material layer 308 that underlies the area of a stack of a tunnel dielectric layer 310, a charge storage region 320, and an overlying portion of the dielectric material layer 330. The charge storage region 320 can be a charge storage material pillar extending in the first direction and separated from the semiconductor material pillar by the tunnel dielectric layer 310. The semiconductor channel 306 comprises a portion of a semiconductor material pillar etched into the major surface 100a of the substrate 100. The blocking dielectric layer 350 can be located over the charge storage material pillar. A control gate electrode 360 is separated, and electrically insulated, from the charge storage material pillar. The semiconductor device can comprise a NAND device.

A portion of the semiconductor material pillar adjacent to the tunnel dielectric layer 310 has a width, which is herein referred to as a first width w1, in a second direction (a horizontal direction) perpendicular to the first direction (the vertical direction). A portion of the charge storage material pillar adjacent to the tunnel dielectric layer 310 has a different width, which is herein referred to as a second width w2. In one embodiment, the first width w1 is at least 2 nm less than the second width w2. In another embodiment, the first width w1 is at least 4 nm (such as 4 nm-60 nm, e.g., 10 nm-60 nm) less than the second width w2.

In one embodiment, the semiconductor material pillar can be substantially cylindrical, and can have a diameter equal to the first width w1, i.e., the width of the portion of the semiconductor material pillar adjacent to the tunnel dielectric layer 310. Additionally, the charge storage material pillar can be substantially cylindrical, and can have a diameter equal to the second width w2, i.e., the width of the portion of the charge storage material pillar adjacent to the tunnel dielectric layer 310.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A semiconductor device comprising:
   a stack of layers arranged in the following order in a first direction extending transverse to a major surface of a substrate:
   a semiconductor channel;
   a tunnel dielectric layer; and
   a charge storage region electrically separated from the semiconductor channel by the tunnel dielectric layer; and
   wherein:
   the semiconductor channel has a first sidewall;
   the charge storage region has a first sidewall; and
   the first sidewall of the semiconductor channel is overhung by the first sidewall of the charge storage region by a first offset distance in a second direction transverse to the first direction; and
   the first offset distance is greater than 1 nm.

2. The semiconductor device of claim 1, wherein the first offset distance is greater than about 2 nm.

3. The semiconductor device of claim 1, wherein the first offset distance is greater than about 5 nm.

4. The semiconductor device of claim 1, wherein the first offset distance is 10-30 nm.

5. The semiconductor device of claim 1, wherein the semiconductor channel comprises a portion of a semiconductor material pillar etched into the major surface of the substrate.

6. The semiconductor device of claim 1, further comprising:
   a blocking dielectric layer located over an upper surface and on a side surface of the charge storage region; and
   a control gate electrically insulated from the charge storage region by the blocking dielectric layer.

7. The semiconductor device of claim 6, wherein:
   the semiconductor device comprises a NAND device;
   the charge storage region comprises a floating gate;
   a silicon nitride layer is located on the upper surface of the floating gate; and the semiconductor channel comprises a silicon channel.

8. The semiconductor device of claim 1, further comprising:
   an opening in the layer stack extending in the first direction, the opening having a first sidewall and a second sidewall,
   wherein:
   the first sidewall of the opening comprises the first sidewall of the semiconductor material layer and the first sidewall of the charge storage region;
   the second sidewall of the opening comprises a second sidewall of the semiconductor channel and a sidewall of a second charge storage region;
   the second sidewall of the semiconductor channel is overhung by the sidewall of the second charge storage region by a second offset distance in the second direction; and
   the second offset distance is greater than 1 nm.

9. The semiconductor device of claim 8, wherein the second offset distance is greater than about 2 nm.

10. The semiconductor device of claim 8, wherein the second offset distance is greater than about 5 nm.

11. The semiconductor device of claim 8, wherein a lower portion of the opening is substantially filled with electrically insulating material.

12. A semiconductor device comprising:
    a vertical stack, from bottom to top, of a semiconductor material pillar, a tunnel dielectric layer, and a charge storage material pillar, the vertical stack extending along a vertical direction that is transverse to a major surface of a substrate, wherein:
    the semiconductor material pillar extends in a first direction that is parallel to the vertical direction; and
    the charge storage material pillar extends in the first direction and is separated from the semiconductor material pillar by the tunnel dielectric layer,
    wherein a portion of the semiconductor material pillar adjacent to the tunnel dielectric layer has a width in a second direction perpendicular to the first direction that is at least 2 nm less than the width of a portion of the charge storage material pillar adjacent to the tunnel dielectric layer.

13. The semiconductor device of claim 12, wherein the portion of the semiconductor material pillar adjacent to the tunnel dielectric layer has the width in the second direction that is at least 4 nm less than the width of a portion of the charge storage material pillar adjacent to the tunnel dielectric layer.

14. The semiconductor device of claim 12, wherein:
    the semiconductor material pillar comprises another portion that is spaced farther from the portion of the semiconductor material pillar adjacent to the tunnel dielectric layer and has a greater width than the width of the portion of the semiconductor material pillar adjacent to the tunnel dielectric layer.

15. The semiconductor device of claim 12, further comprising a blocking dielectric layer located over the charge storage material pillar and a control gate electrode separated and electrically insulated from the charge storage material pillar, wherein the semiconductor device comprises a NAND device.

16. A method of making a semiconductor device comprising:
providing a stack of layers arranged in the following order in a first direction extending transverse to a major surface of a substrate:
a semiconductor material layer;
a tunnel dielectric layer; and
a charge storage material layer electrically separated from the semiconductor material layer by the tunnel dielectric layer;
etching the stack to form an opening in the stack comprising a first sidewall of the opening, the first sidewall of the opening comprising a first sidewall of the semiconductor material layer and a first sidewall of the charge storage material layer;
forming a masking layer on portion of the first sidewall of the first opening that covers the first sidewall of the charge storage material layer while leaving the first sidewall of the semiconductor material layer exposed; and
etching the stack to further widen an unmasked portion of opening including the first sidewall of the semiconductor material layer such that the first sidewall of the semiconductor material layer is overhung by the first sidewall of the charge storage material layer by a first offset distance in a second direction transverse to the first direction.

17. The method of claim 16, wherein the first offset distance is greater than about 1 nm.

18. The method of claim 16, wherein the first offset distance is between 5 and 30 nm.

19. The method of claim 16, wherein the semiconductor material layer comprises a semiconductor material pillar etched into the major surface of the substrate.

20. The method of claim 16, wherein the masking layer comprises an amorphous carbon, silicon nitride, metal oxide, or metal nitride masking layer.

21. The method of claim 16, further comprising removing the masking layer from the opening.

22. The method of claim 21, wherein the masking layer comprises an amorphous carbon masking layer, and wherein removing the masking layer from the opening comprises ashing the masking layer.

23. The method of claim 21, further comprising:
substantially filling a lower portion of the opening adjacent to the semiconductor material layer with electrically insulating material after the step of removing the masking layer;
forming a blocking dielectric layer over the charge storage material layer after the step of substantially filling; and
forming a control gate electrode over the blocking dielectric layer, wherein the control gate electrode is electrically insulated from the charge storage material layer by the blocking dielectric layer.

24. The method of claim 23, wherein:
the semiconductor device comprises a NAND device;
the charge storage material layer comprises a floating gate;
a silicon nitride layer is located on the upper surface of the floating gate; and
the semiconductor material layer comprises a silicon channel.

25. The method of claim 16, wherein:
the opening comprising a second sidewall,
the second sidewall of the opening comprises a second sidewall of the semiconductor material layer and a sidewall of a second charge storage material layer;
the second sidewall of the semiconductor material layer is overhung by the sidewall of the second charge storage material layer by a second offset distance in the second direction; and
the second offset distance is greater than 1 nm.

26. A method of making a semiconductor device, comprising:
forming a stack of layers comprising a first material and a second material that overlies the first material;
etching the stack to form at least one opening in the stack, the at least one opening comprising an opening;
forming a masking layer on a sidewall of the upper portion of the at least one opening and on a surface of the second material, wherein, throughout formation of the masking layer, a sidewall of the lower portion of the at least one opening is not covered by the masking layer and comprises a physically exposed surface of the first material; and
further etching the lower portion of the at least one opening to widen the lower portion of the at least one opening while the masking layer remains on the sidewall of the upper portion of the at least one opening.

27. The method of claim 26, wherein:
the step of etching the stack comprises using reactive ion etching; and
the step of further etching comprises wet etching or reactive ion etching the first and second material layers of the stack exposed in the lower portion of the at least one opening, while the masking layer protects the upper portion of the opening from the further etching.

28. The method of claim 27, wherein the masking layer comprises a non-conformal sidewall spacer.

29. The method of claim 27, wherein the masking layer comprises an amorphous carbon, silicon nitride, silicon oxide, metal oxide or metal nitride masking layer.

30. The method of claim 27, further comprising completely removing the masking layer from the sidewall of the at least one opening.

31. The method of claim 30, wherein the masking layer comprises an amorphous carbon masking layer and the step of removing the masking layer from the sidewall comprises ashing the amorphous carbon masking layer.

32. The method of claim 31, wherein the step of removing the masking layer from the sidewall comprises selectively wet etching the masking layer.

33. The method of claim 27, further comprising:
forming a hard mask over the stack; and
patterning the hard mask to form at least one hard mask opening which exposes the stack;
wherein etching the stack comprises etching the stack through the at least one hard mask opening; and
wherein forming the masking layer comprises forming the masking layer over an upper surface of the hard mask in addition to forming the masking layer on the sidewall of the upper portion of the at least one opening.

34. The method of claim 27, wherein:
the semiconductor device comprises a NAND string; and
the device contains a control gate electrode, a blocking dielectric layer, a charge storage region and a tunnel dielectric.

* * * * *